(12) United States Patent
Helneder

(10) Patent No.: US 8,148,227 B2
(45) Date of Patent: Apr. 3, 2012

(54) METHOD FOR PROVIDING A SELF-ALIGNED CONDUCTIVE STRUCTURE

(75) Inventor: Johann Helneder, Pliening (DE)

(73) Assignee: Infineon Technologies AG, Neubiberg (DE)

( * ) Notice: Subject to any disclaimer, the term of this patent is extended or adjusted under 35 U.S.C. 154(b) by 371 days.

(21) Appl. No.: 12/259,200

(22) Filed: Oct. 27, 2008

(65) Prior Publication Data
US 2010/0102364 A1    Apr. 29, 2010

(51) Int. Cl.
*H01L 21/336* (2006.01)
(52) U.S. Cl. ............... 438/299; 257/E21.453
(58) Field of Classification Search .......... 438/183, 438/197, 216, 287, 288, 591, 595, 299–301; 257/288, 295, 344, 389, 411, 412, E21.453, 257/E29.133, E29.152
See application file for complete search history.

(56) References Cited

U.S. PATENT DOCUMENTS

| 6,365,450 B1 * | 4/2002 | Kim | 438/216 |
| 6,506,673 B2 * | 1/2003 | Ma et al. | 438/622 |
| 6,812,106 B1 * | 11/2004 | Xiang et al. | 438/301 |
| 2006/0228844 A1 | 10/2006 | Culmsee et al. | |

\* cited by examiner

*Primary Examiner* — Brook Kebede
(74) *Attorney, Agent, or Firm* — Slater & Matsil, L.L.P.

(57) ABSTRACT

An embodiment according to the present invention comprises a method for providing a self-aligned conductive structure comprising providing a first structure on a surface, wherein the first structure comprises a first and a second layer, and providing an intermediate structure on the surface, wherein the intermediate structure at least partially abuts the first structure laterally at a first lateral edge of the first structure. The method further comprises removing at least a part of the second layer, the part being adjacent to the first lateral edge, and providing the conductive structure such that the conductive structure replaces at least the removed part of the second layer and abuts the first lateral edge.

25 Claims, 33 Drawing Sheets

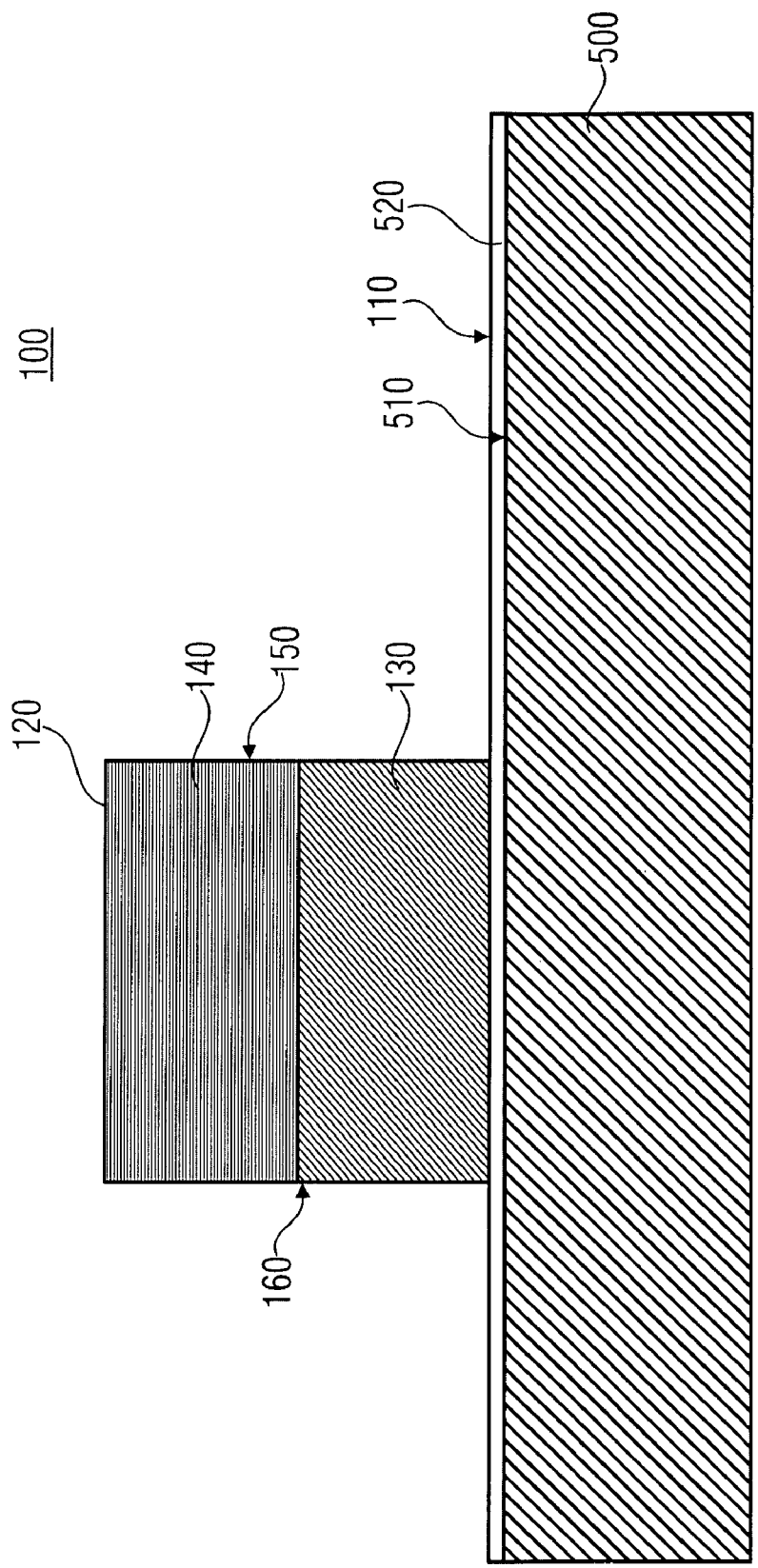

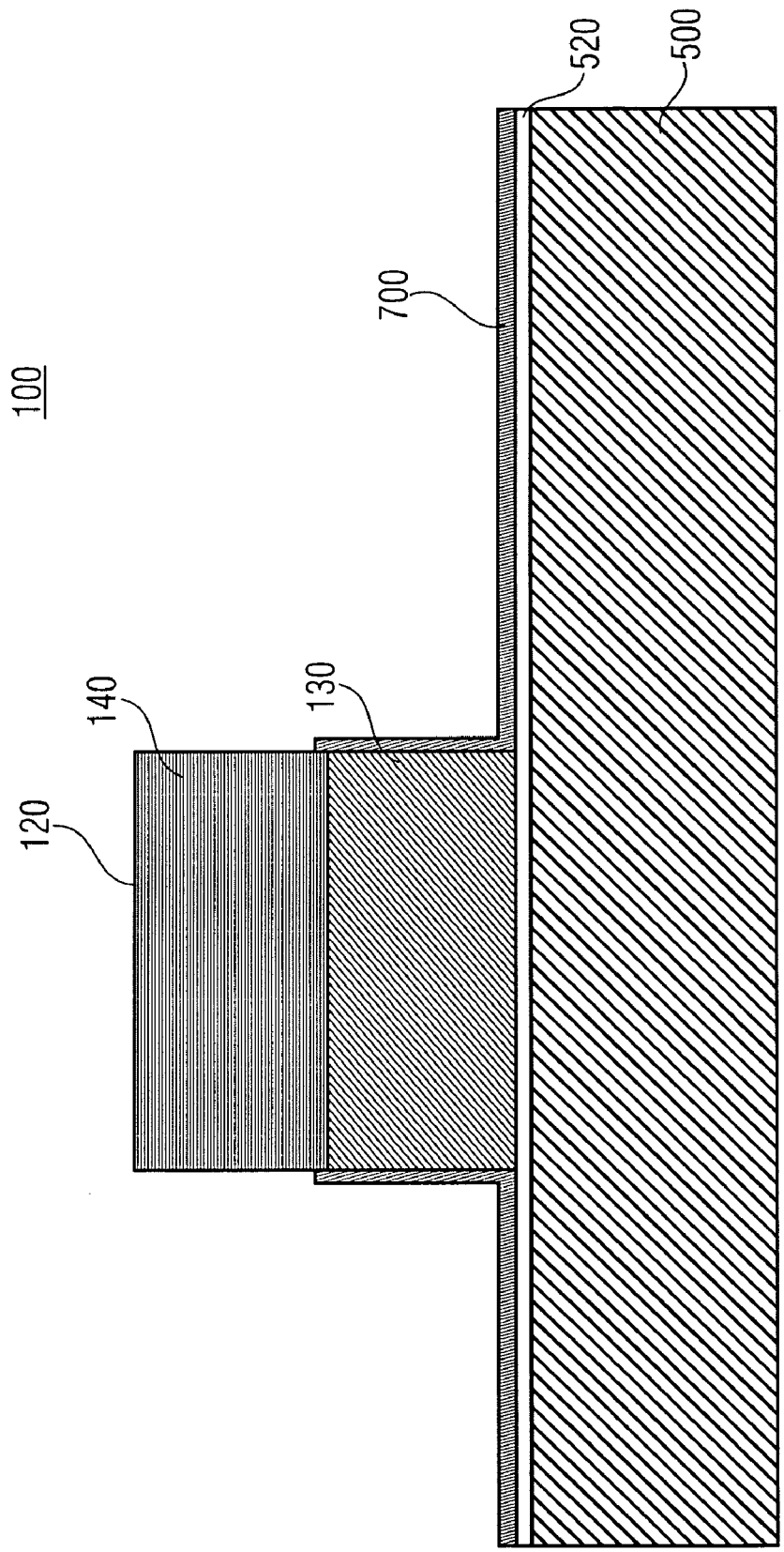

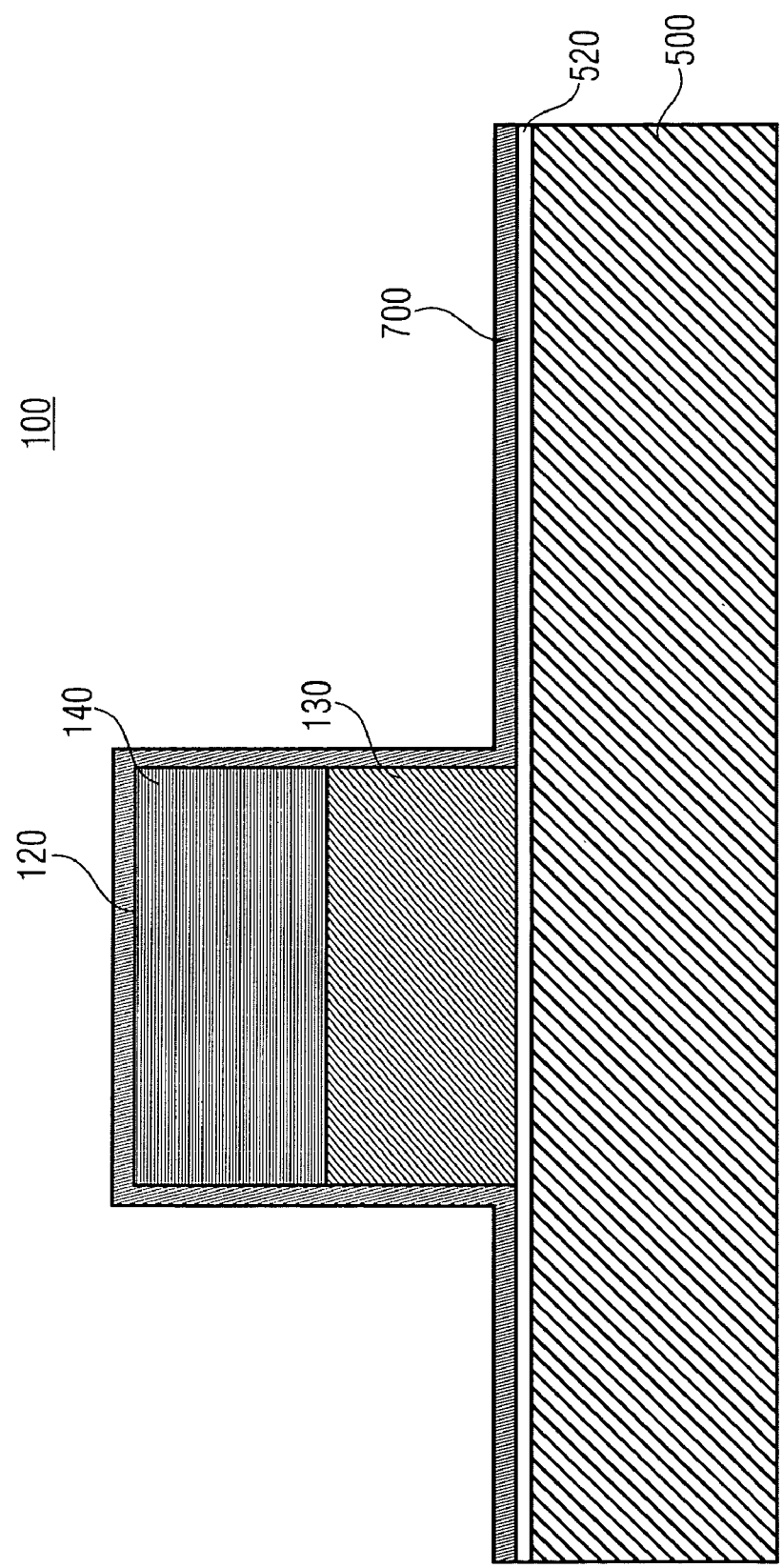

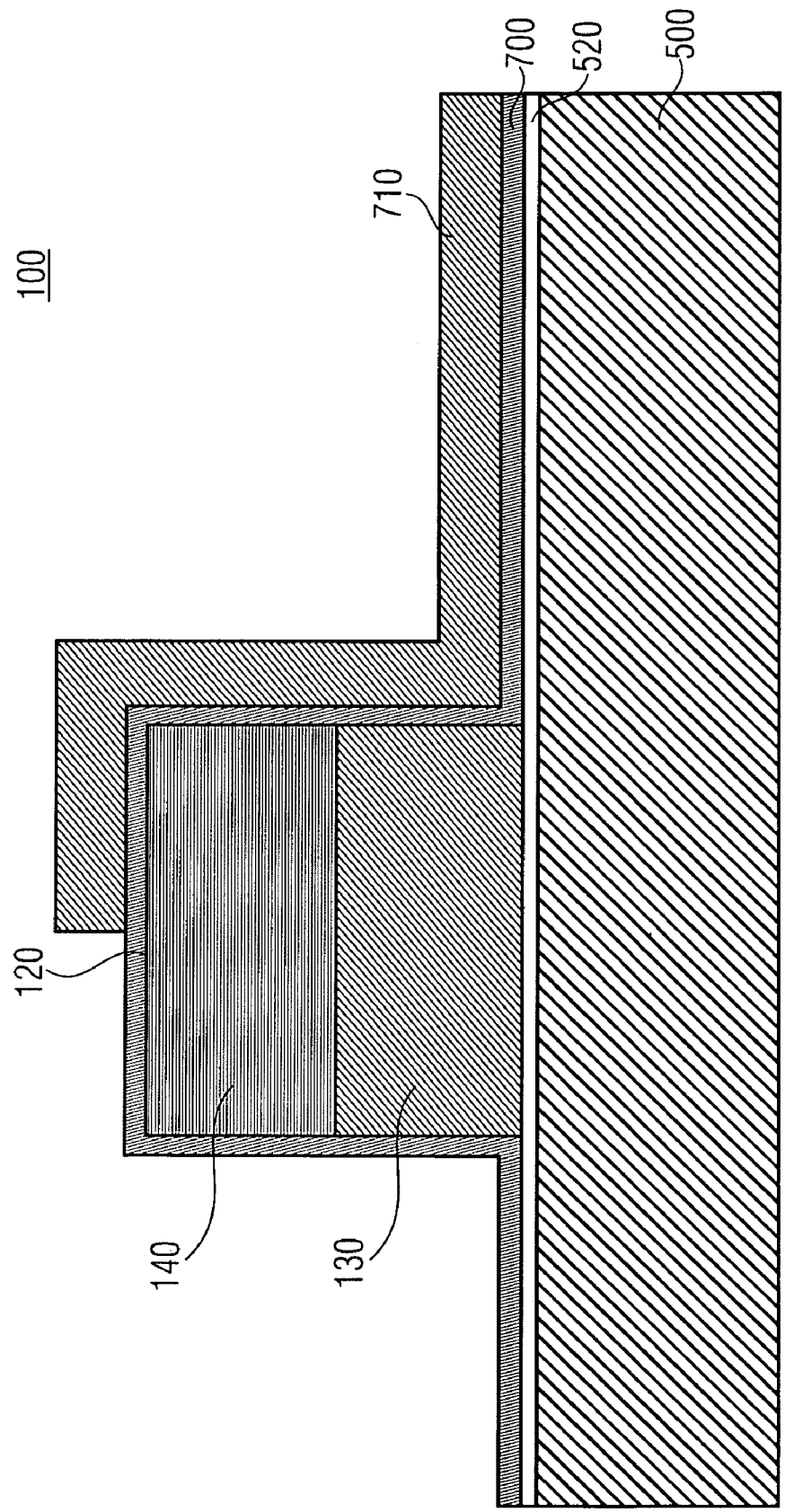

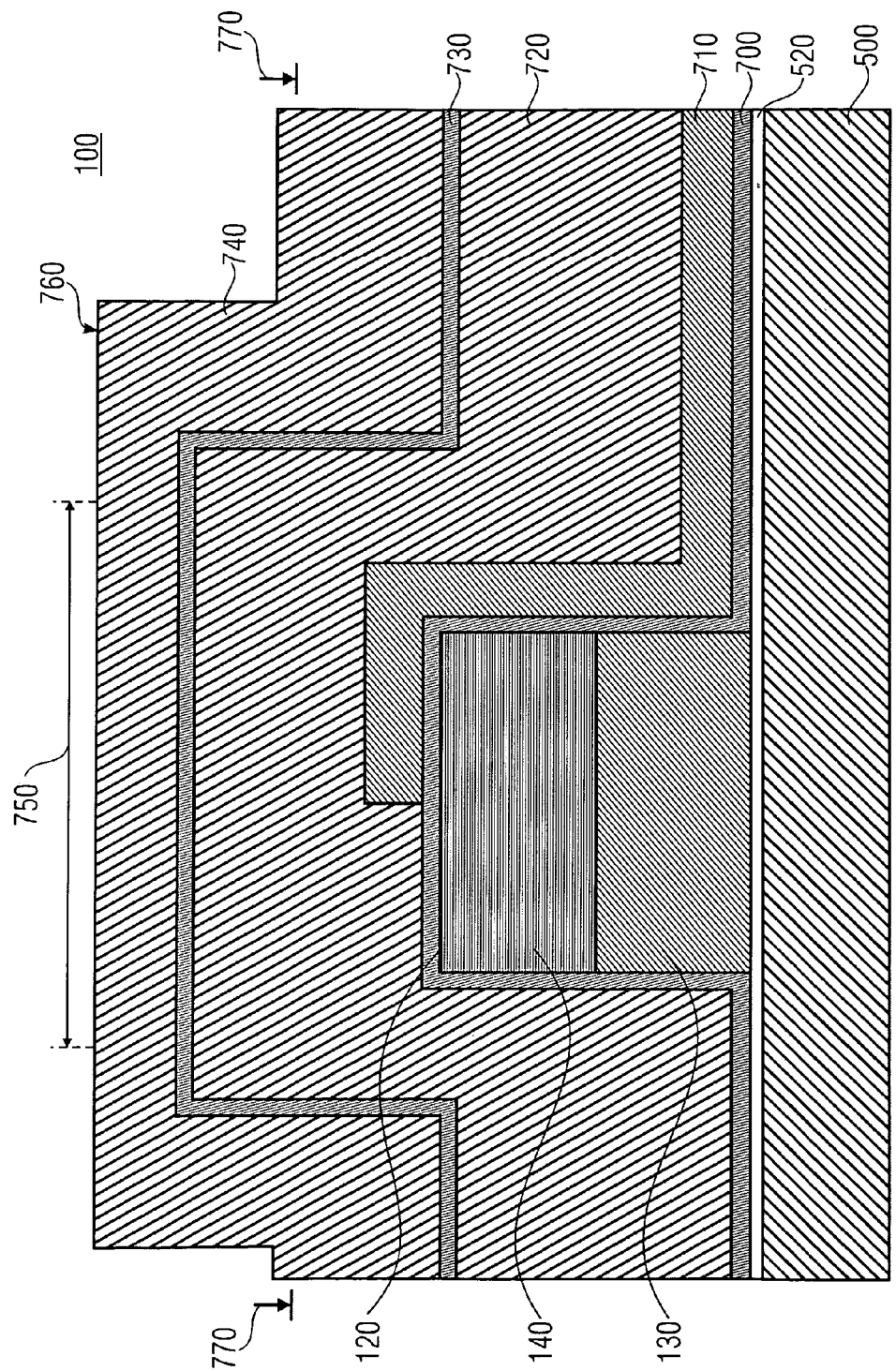

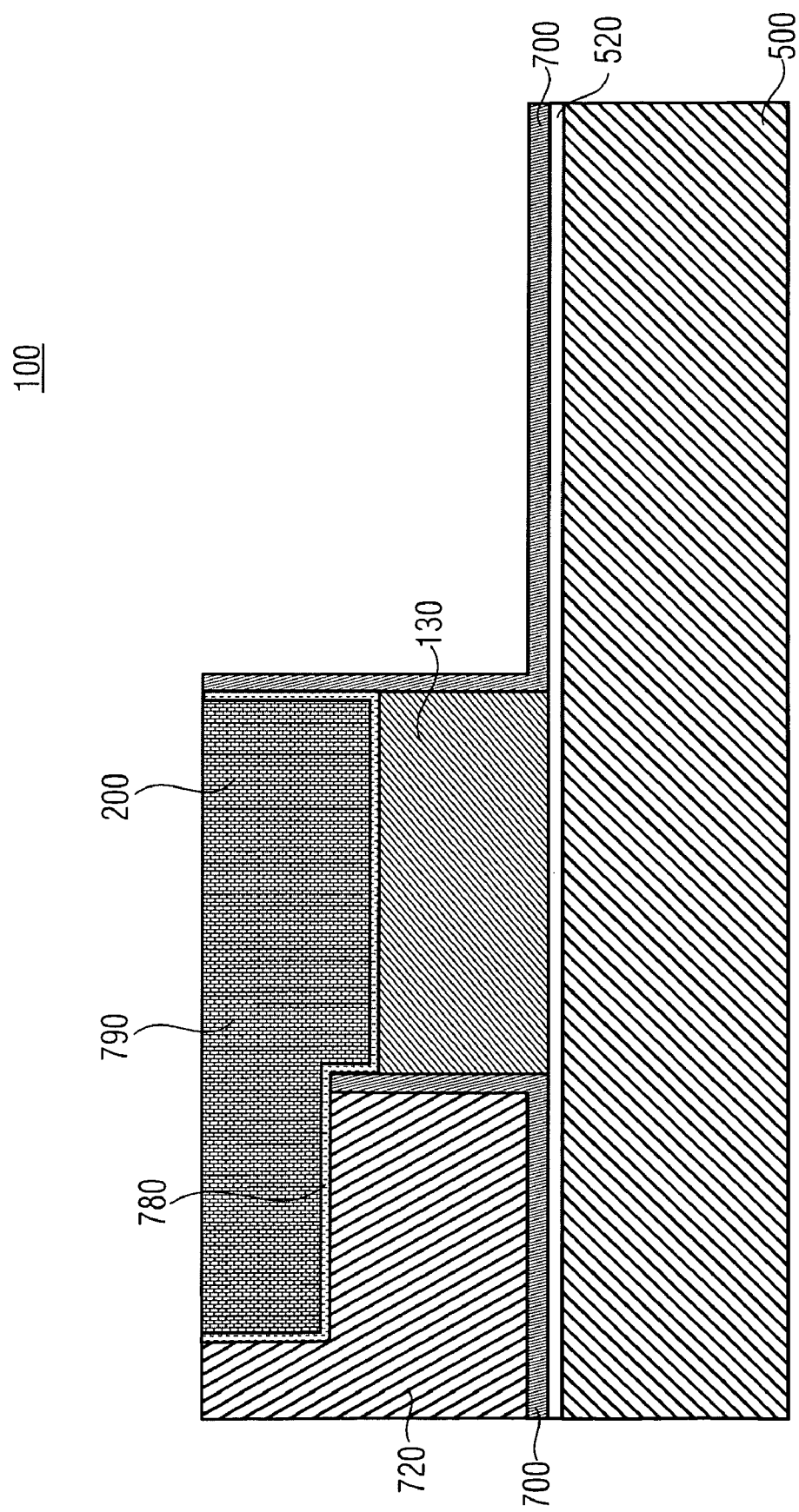

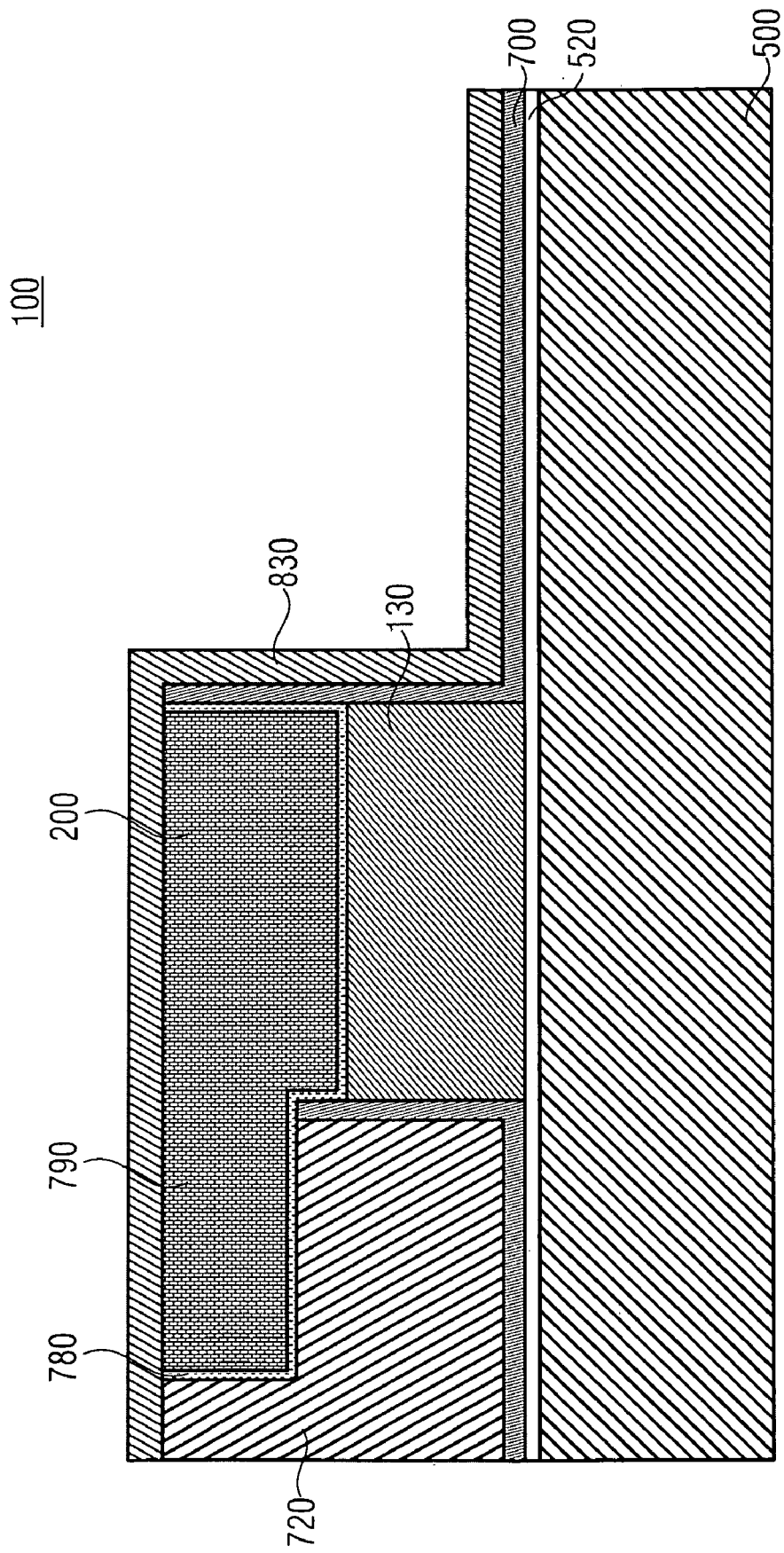

METHOD FOR PROVIDING A SELF-ALIGNED CONDUCTIVE STRUCTURE

BACKGROUND

Integrated circuits and corresponding electrical and electronic devices implemented in the form of integrated circuits are widely used in today's technology. Manufacturing integrated circuits typically requires several ten to several hundred individual process steps such as depositing semiconducting, conducting or insulating layers, doping regions of a semiconductor, and etching, to name but a few.

Many of these and similar process steps are supposed to influence an underlying substrate only locally. For instance, when etching a trench or when doping a region of a semiconducting substrate to form, for instance, an n-doped area, the physical or chemical effects of the corresponding process step are often intended to be limited to individual locations and positions on the substrate. As a consequence, aligning the substrate with respect to its position, orientation, tilt and further parameters from process step to process step is in many cases advisable.

The situation may even become more complex when some process steps, such as a tempering step, an activation step or other chemical or physical treatment steps, need to be applied prior to or after other steps, limiting the possibilities of designing the corresponding process flow. Moreover, further parameters such as the performance of the device, costs, properties of individual structures (e.g., electrical properties), stress-related properties, chemical and physical properties may impose further boundary conditions concerning the design of the process flow. These considerations may also limit the freedom concerning alignment requirements between different process steps.

Deficiencies concerning the alignment of the substrate may also require implementing larger structures, which in turn may limit the possibilities of improving an integration density of more complex devices on the same surface of the substrate. Hence, a need exists for improved alignment in many fields of device and integrated circuit fabrication.

BRIEF DESCRIPTION OF THE DRAWINGS

Embodiments according to the present invention will be described hereinafter making reference to the appended drawings.

DETAILED DESCRIPTION OF ILLUSTRATIVE EMBODIMENTS

In the following, embodiments according to the present invention will be described in more detail. First, with reference to FIGS. 1 and 2a to 2d a first embodiment according to the present invention in the form of a method for providing a self-aligned conductive structure will be described before some optional modifications of the previously outlined method will be described with reference to FIG. 2e. Next, with reference to FIGS. 3 and 4a to 4d another embodiment according to the present invention in the form of a method for providing a self-aligned conductive structure will be described, followed by corresponding optional implementations described in context with FIG. 4e.

Figure 5:
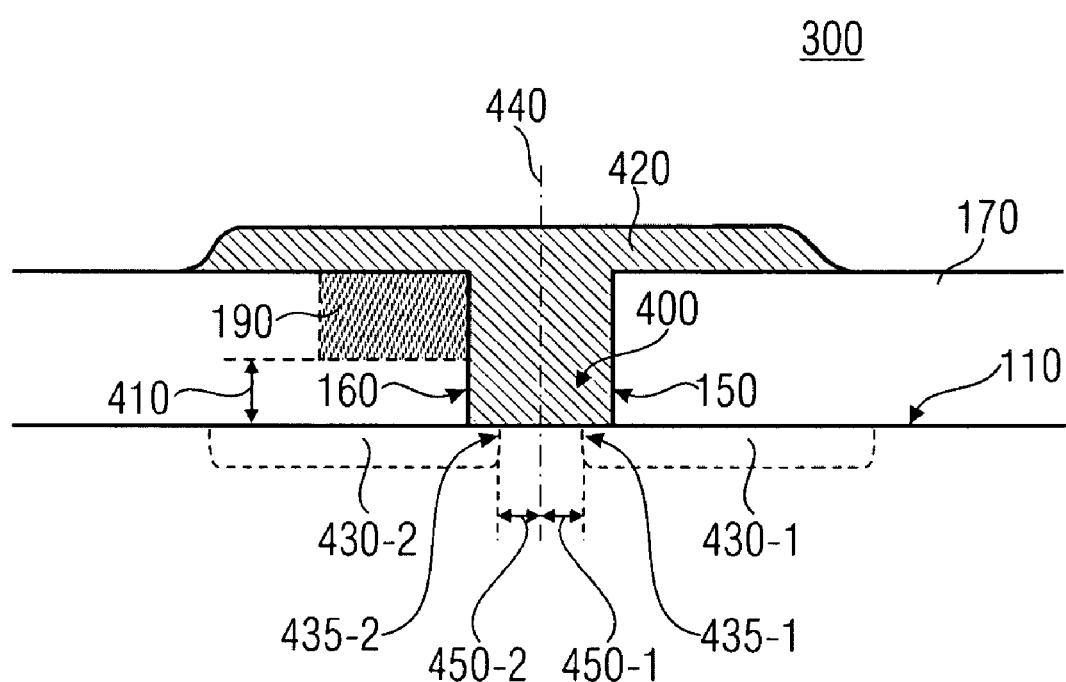
FIG. 5 shows a cross-sectional view of a device according to an embodiment of the present invention.
Figure 6:
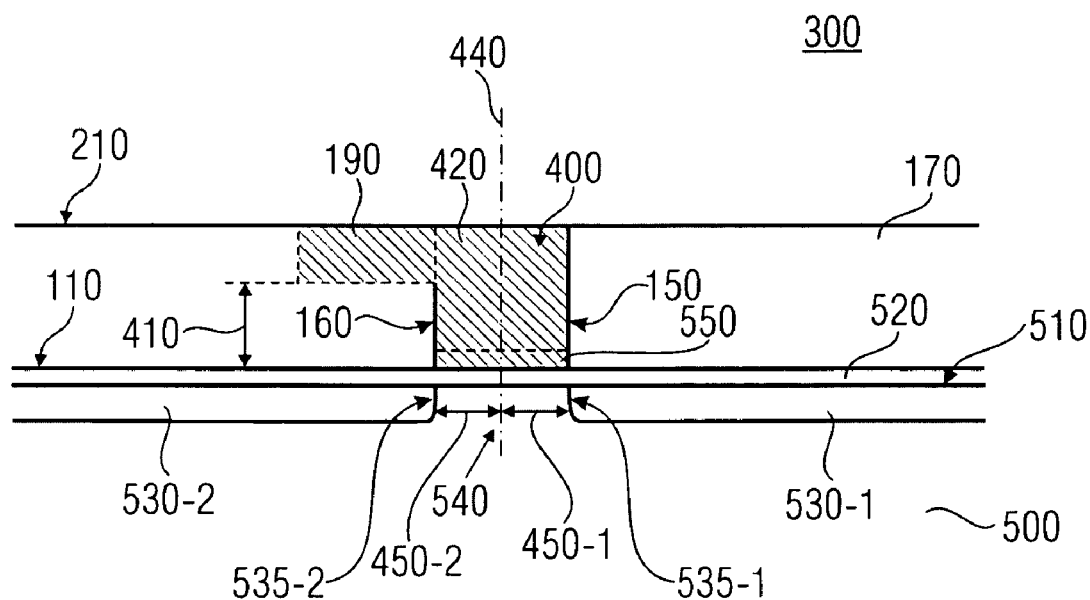
FIG. 6 shows a cross-sectional view of a field effect transistor according to an embodiment of the present invention.
Figure 7:
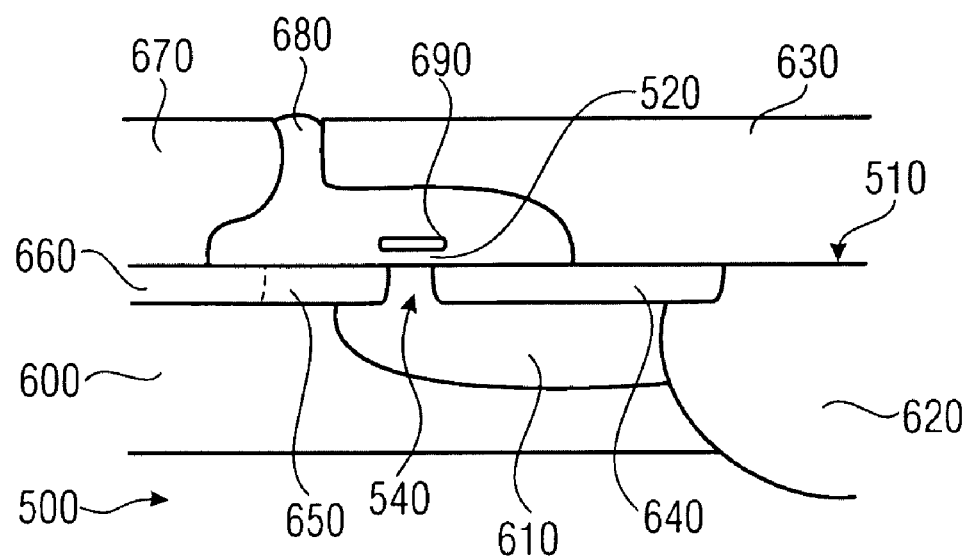
FIG. 7 shows a cross-sectional view of a LDMOS-transistor.

FIGS. 5 and 6 show a device and a field effect transistor according to embodiments of the present invention, while with reference to FIG. 7 a brief introduction into a LDMOS transistor (LDMOS=laterally diffused metal oxide semiconductor) will be presented.

Figure 8D:
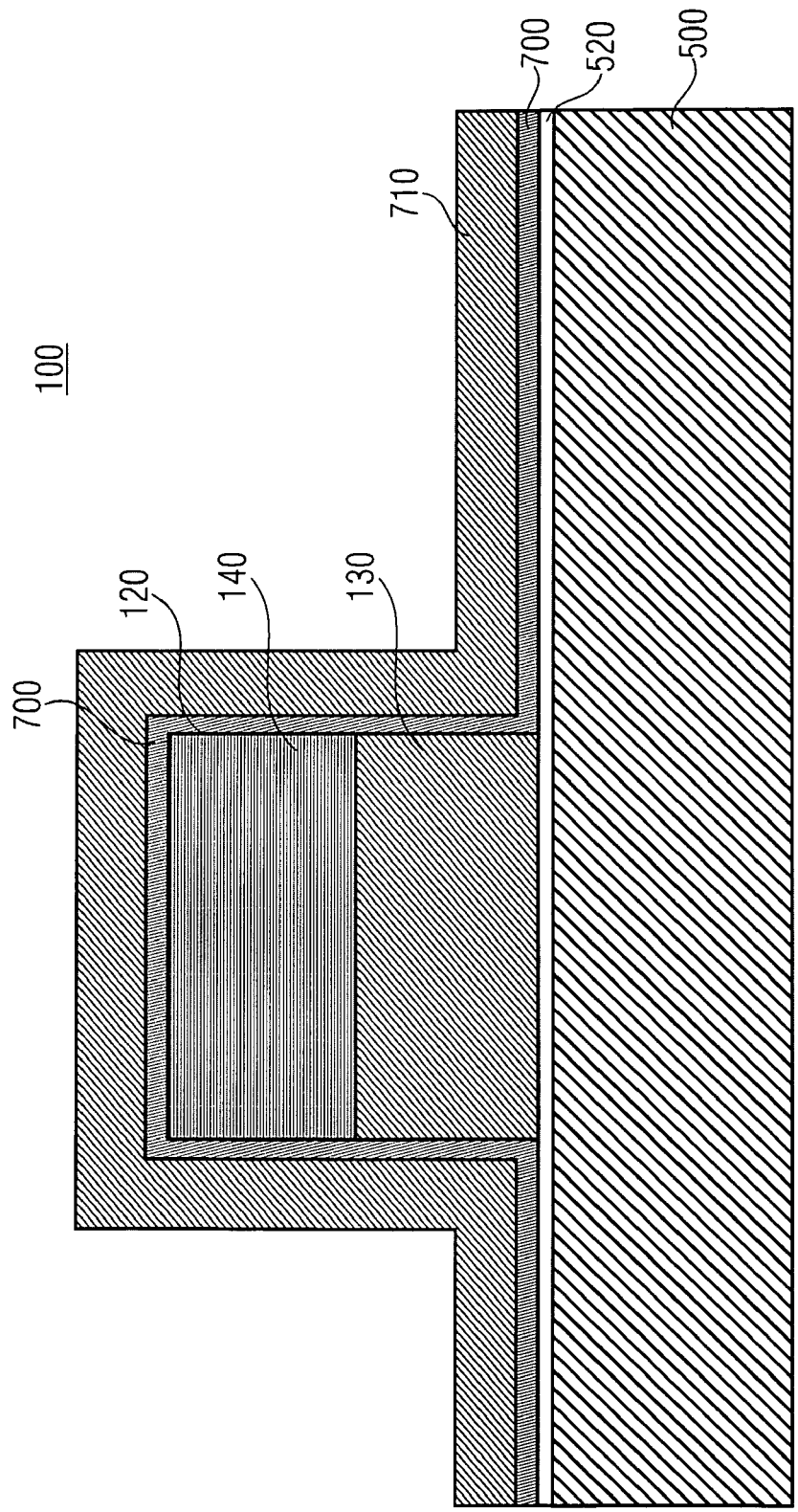
FIGS. 8a to 8u show cross-sectional views of a device, fabricated by employing a method according to an embodiment of the present invention, at different stages.

A process flow concerning a LDMOS transistor according to an embodiment of the present invention will be described in detail with respect to FIGS. 8a to 8u, including further optional modifications. Finally, with respect to FIGS. 9a to 9c a further option concerning the process flow of FIGS. 8a to 8u will be described, offering the possibility of generating an additional field plate for a LDMOS transistor, which may be optionally incorporated into the process flow of FIG. 8.

In the following, identical or similar structures and objects shall be referred to by identical or similar reference signs in the figures. Unless noted otherwise, parts of the description which refer to identical or similar structures and objects may be substituted by or supplemented with parts of the description which refer to corresponding structures and objects described elsewhere. This allows for a clearer, yet concise description of embodiments according to the present invention.

Moreover, summarizing reference signs will be used for structures and objects appearing more than once in an embodiment according to the present invention. Unless a property, a feature or another attribute of a specific structure or object is considered, summarizing reference signs will be used to describe properties, features and other attributes of the respective structures and objects.

Figure 1:
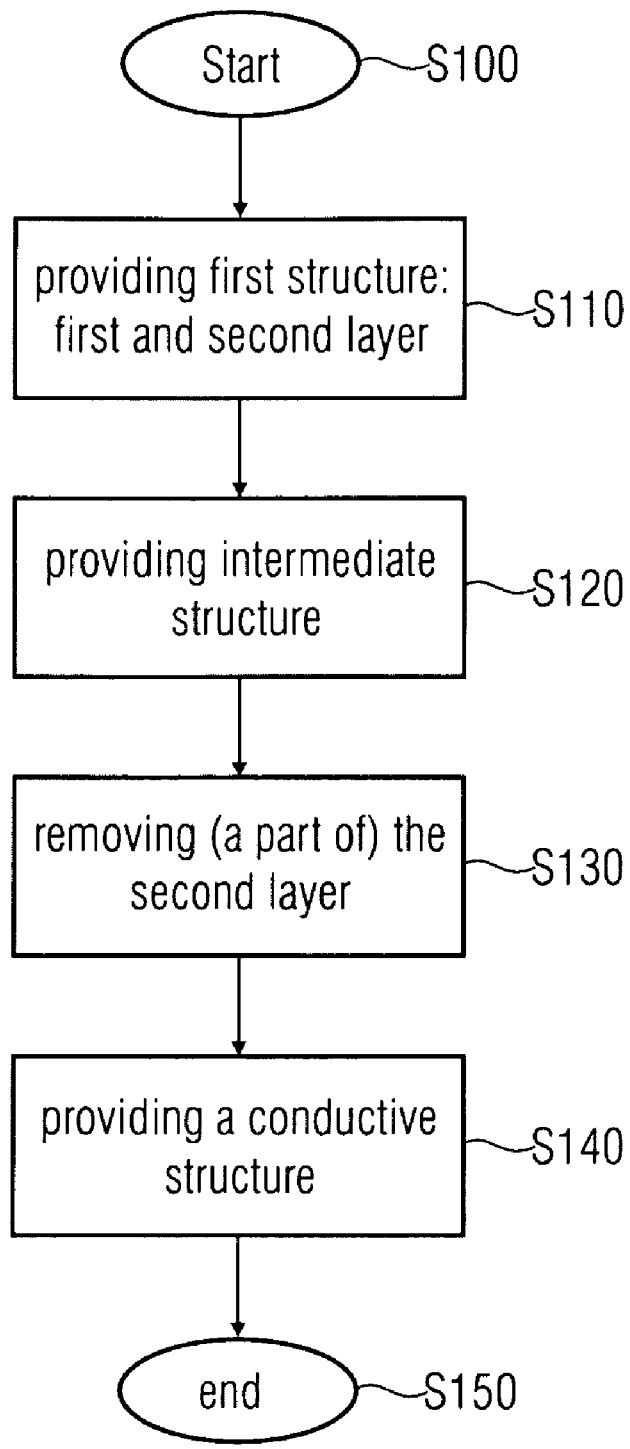
FIG. 1 shows a flowchart of a method for providing a self-aligned conductive structure according to an embodiment of the present invention.

FIG. 1 shows a flowchart of a method for providing a self-aligned conductive structure according to an embodiment of the present invention. After the method starts in step S100, a first structure 120 comprising a first layer 130 and a second layer 140 is provided or formed, which may equally well be used, on a surface 110 in a step S110.

Figure 2A:
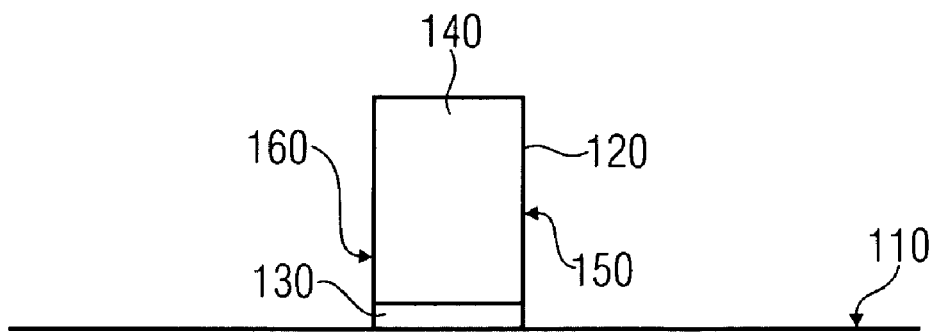
FIGS. 2a to 2d show cross-sectional views of a device, fabricated by employing a method according to an embodiment of the present invention, at different stages of the fabrication.

To illustrate this in more detail, FIG. 2a shows a cross-sectional view of a corresponding device 100. The device 100 comprises a surface 110, which may be the surface of a substrate, a layer or any other corresponding structure. The first layer 130 is directly deposited onto the surface 110. The second layer 140 then is deposited on top of the first layer 130. The deposition steps may than be followed by patterning step and an etching step to obtain the first structure 120 comprising the two layers 130, 140.

The deposition of the first and second layers 130, 140 may be achieved by one or more chemical, physical or chemical/physical deposition techniques. The patterning and etching steps may comprise photo-lithographic patterning of the generated stack of the first and second layers 130, 140 and etching the stack by a wet or a dry etching process comprising a chemical, physical or a combined physical/chemical etching process to obtain the first structure 120 as shown in FIG. 2a.

Hence, the first structure 120 comprises the first and second layers 130, 140, which are arranged vertically and laterally extend from a first lateral edge 150 of the first structure 120 to an opposite, second lateral edge 160 of the same first structure 120.

Figure 2B:
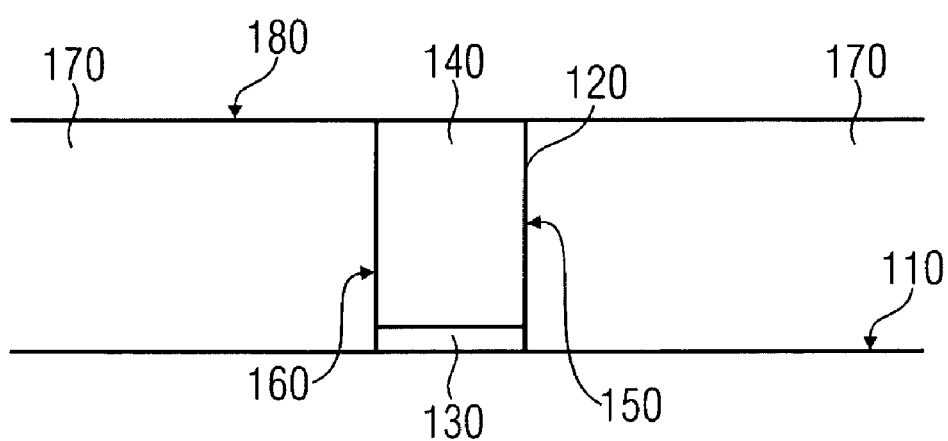

In a step S120, shown in FIG. 1, an intermediate structure 170 is provided on the surface 110 such that the intermediate structure 170 at least partially laterally abuts the first structure 120 at the first lateral edge 150. FIG. 2b shows the corresponding situation, in which the intermediate structure 170 also laterally abuts the opposite second lateral edge 160.

Such an intermediate structure 170 may be, for instance, generated by depositing one or more corresponding materials of the intermediate structure 170 onto the surface 110 and the first structure 120. Depending on the deposition technique used, this may optionally include depositing material directly onto the first and second lateral edges 150, 160. This may be achieved by employing conformal deposition techniques, such as CVD (chemical vapor deposition) or a sputter deposition technique. After that, the structure generated may be leveled by using, for instance, a non-selective etching process, a polishing process, a lapping process, or a CMP process (CMP=chemical-mechanical polishing). Further details of possible processes will be given below in the context of FIG. 8.

In other words, providing the intermediate structure 170 in step S120 comprises depositing at least one layer of a material of the intermediate structure 170, and may furthermore comprise reducing a thickness of the deposited layer such that the common surface 180 of the intermediate structure 170 and the first structure 120 is formed.

The first layer 130 may, for instance, comprise an electrically conductive material, an optically conductive material or any other suitable material for the purpose of creating future devices. As will become apparent from the further description of the process, the second layer may often be considered to be a sacrificial layer. The second layer 140 and the intermediate structure 170 often comprise different material compositions. The first and the second layers 130, 140, too, may comprise different material compositions. The intermediate structure 170 may, for instance, be intended to electrically insulate the conductive structure to be deposited in the case of an electrically conductive first layer 130. As a consequence, the intermediate structure 170 also comprises, in many cases, an electrically insulating material to laterally insulate the first layer 130.

In the case of an electrically conductive structure, the first and second layers 130, 140 may, for instance, each comprise an oxide (e.g., $SiO_x$), a nitride (e.g., $SiN_x$), an oxynitride (often referred to as SiON, $SiO_xN_y$), silicon (Si), polycrystalline silicon (polysilicon, Si), aluminum (Al), copper (Cu), gold (Au), platinum (Pt), tungsten (W), or silver (Ag). The intermediate structure 170 may comprise an oxide (e.g., $SiO_x$), a nitride (e.g., $SiN_x$), PSG (phosphorous silicon glass or phosphosilicate glass), BPSG (borophosphosilicate glass), or oxynitride.

Figure 2C:
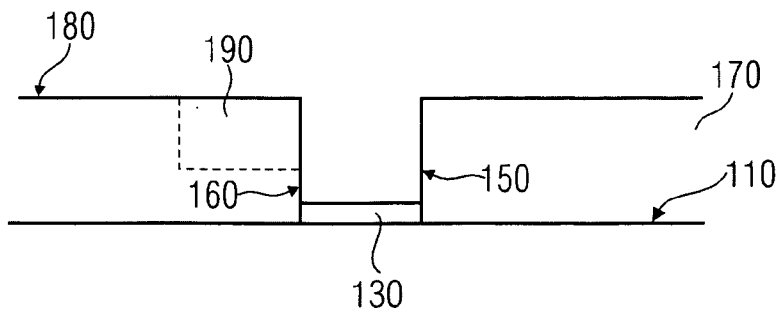

In a step S130, shown in FIG. 1, at least part of the second layer 130 adjacent to the first lateral edge 150 and optionally also adjacent to the second lateral edge 160 is removed, as illustrated in FIG. 2c. FIG. 2c shows the situation in which the second layer is completely removed from the first structure 120.

Removing the second layer 140 either partially or completely may technically be achieved by employing a selective etching technique, which keeps the intermediate structure 170 and optionally the first layer 130 intact at the same time. This may be achieved by employing different material compositions for at least the second layer 140 and the intermediate structure 170.

Optionally, removing the second layer 140 in step S130 may also comprise generating an opening 190 in at least the intermediate structure 170 such that the opening is in immediate contact with the first lateral edge 150, with the second lateral edge 160 or with both lateral edges 150, 160. FIG. 2c shows the situation in which the optional opening 190 is in direct contact with the second lateral edge 160. A depth of the opening 190 is typically smaller than a height of the intermediate structure 170, which is typically equal to a difference in height between the common surface 180 and the surface 110. As a consequence, a depth of the opening 190 is also smaller than a height of the first structure 120. The opening 190 may, hence, be also referred to as recess 190. Also for other openings being described may equally well be referred to as recesses.

The opening or recess 190 may be generated by photolithographic patterning of the intermediate structure 170 and an additional etching step employing, for instance, ion beam etching (IBE) or a reactive ion etching (RIE) technique. Other etching techniques may also be employed.

In this context, it should be noted that removing the second layer 140 partially or completely and generating the opening 190 may comprise the same process steps or may be based on completely separate process steps. In the case of separate process steps, generation of the opening 190 may be performed before or after the removal of the second layer 140 from the first structure 120.

During generation of the opening 190 it is not necessary to generate the opening 190 to exactly match any of the first or the second lateral edges 150, 160. Depending on the concrete implementation of the process, which may impose additional boundary conditions (e.g., concerning the choice of materials), during generation of the opening 190 also parts of the second layer 140 may be removed. This is in many cases of no importance, since the second layer is often a sacrificial layer.

Finally, before ending the method according to an embodiment of the present invention in step S150, during a step S140 a conductive structure 200 is provided to the device 100, such that the conductive structure 200 replaces at least the removed parts of the second layer 140, and abuts the first lateral edge 150.

Figure 2D:
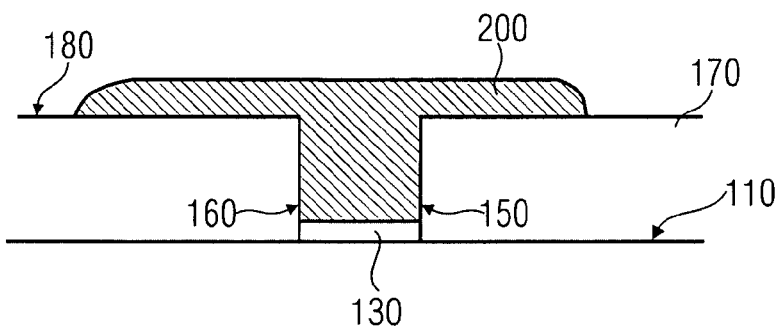

This situation is illustrated in FIG. 2d. The conductive structure 200 is provided to the device 100, thus filling up the removed parts of the second layer 140. In the situation shown in FIG. 2d, the conductive structure 200 also covers at least parts of the former common surface 180. This may be, for instance, achieved by depositing a corresponding conductive film followed by a subsequent patterning process. Alternatively, this structure may also be provided by using a so-called lift-off technique comprising photolithographic patterning of a resist layer, subsequent deposition of a corresponding layer for the conductive structure 200, and removing the excessive material along with the resist layer.

The conductive structure 200 may comprise a material which may be optically, acoustically or electrically conductive, depending on whether the conductive structure 200 is an optically, acoustically or electrically conductive structure 200. In the case of an electrically conductive structure 200, it may comprise, for instance, tungsten (W), titanium (Ti), titanium nitride (TiN), titanium silicide (TiSi), tantalum (Ta), tantalum nitride (TaN), tantalum silicide (TaSi), platinum (Pt), gold (Au), silver (Ag), or copper (Cu).

However, the device 100 may also be an acoustically or optically conductive structure 200. The conductive structure 200 may be intended to be a wave guide for optical or mechanical waves. In these cases different compositions of materials may have to be used.

Figure 2E:
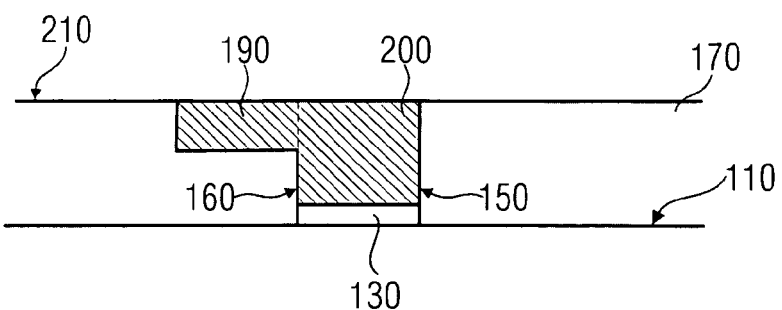
FIG. 2e shows a cross-sectional view of a device fabricated by employing a method according to a further embodiment of the present invention.

FIG. 2e shows a device 100 which corresponds to the situation of FIG. 2d and is fabricated on the basis of a different embodiment according to the present invention. FIG. 2e shows a cross-sectional view differing from that of FIG. 2d mainly with respect to two aspects.

On the one hand, the intermediate structure 170 comprises the optional opening 190 to which—during the step of providing the conductive structure 200 (step S140)—also the material of the conductive structure 200 is provided. In other words, providing the conductive structure (step S140) in this context also comprises providing the conductive structure 200 to the opening 190.

On the other hand, the conductive structure is provided such that a surface of the conductive structure 200 and a surface of the intermediate layer form a common surface 210. The common surface 210 may optionally be identical to the common surface 180 previously generated. However, depending on the concrete implementation of the process steps, a common surface 210 different from the common surface 180 of the first structure 120 and the intermediate structure 170 may be formed.

Technically speaking, after deposition of the material of the conductive structure 200, the device 100 may be subjected to a polishing process, a lapping process or a CMP process, which may be performed until the common surface 210 of the device 100 is generated. In the case of a CMP process, a stop layer may be comprised in the intermediate structure 170 and be deposited on top of the intermediate structure 170, or the material of the intermediate structure 170 may be chosen so that it acts as a stop layer for the CMP process. Alternatively or additionally, the CMP process may also be carried out on a time base such that the process time is long enough to ensure generation of the common surface 210.

Embodiments of the present invention described so far are based on the findings that an improved alignment of a conductive structure 200 with respect to a first layer 130 may be realized by introducing a second layer which is at least partially replaced by the conductive structure 200 without having to deposit the intermediate structure 170 in two or more individual process steps, which might lead to a process flow interrupted by additional patterning steps introducing additional misalignments. Hence, embodiments according to the present invention may allow a more flexible design of the shape and thickness of the intermediate structure 170, independent of the thickness of the conductive structure 200 and the thickness of the first layer 130. Moreover, an elevated risk of increased misalignment due to the additional patterning steps may be reduced.

As indicated earlier, patterning steps typically comprise depositing a resist, which may be photo-lithographically patterned by being exposed to an appropriate wavelength via a reticle. The reticle itself comprises the structure as a negative, a positive or a phase-modulated structure which is to be transferred into the resist. After that, the exposed resist is developed, leaving the resist with a structure as defined by the reticle.

Since many thin-film process steps typically generate structures which have to be aligned with respect to each other, alignment of a reticle with the already generated structures may be important, at least with respect to small structures. The necessary alignment between the device and the reticle is usually not perfect, but subjected to tolerances which may depend on the technologies involved.

Since misalignments typically pose the risk of generating weak links or even a complete breakdown of the respective structure, the structures of the respective reticles typically comprise larger interface areas defining a tolerance range for misalignments during the fabrication process. These enlarged interface areas, however, often take up additional space on the surface of the substrate which in turn may limit the possibility of achieving high integration density. As a consequence, due to the desire to achieve higher integration density, improvements concerning the alignment are often desirable. Likewise, it may be often even desirable to optionally dispense with patterning steps.

Embodiments according to the present invention described so far may furthermore offer the advantage that the materials deposited for the intermediate structure 170, the first layer 130, the second layer 140 and the conductive structure 200 may be more flexibly chosen according to boundary conditions imposed by performance, costs, process flow and other device-related and fabrication-related issues. One reason for such increased flexibility is the fact that the individual process steps as described before need not be carried out successively and in the order described. In other words, after deposition and generation of the first structure comprising the first and second layers 130, 140, further process steps may be carried out which may, for instance, require the device 100 to be subjected to fabrication-related conditions such as temperature, atmospheres and other influences from which the conductive structure 200 has to be protected.

Just as the generation of the opening 190 and the deposition of a conductive structure 200 into the opening 190 as described in the context of FIG. 2e have shown, the additional flexibility and/or the improved alignment offered by a method according to an embodiment of the present invention described so far do not limit subsequent process steps, such as generating a via on top of the conductive structure 200 or introducing other thin film-related structures.

Introduction of an opening 190 allows generating an enlarged contact area for the conductive structure which may be larger than the area of a former first structure 120 including the two layers 130, 140. In other words, embodiments according to the present invention do not require special techniques to connect the conductive structure 200 to other structures but allow standard techniques and standard designs to be used.

Before describing further embodiments according to the present invention it should be noted that the surface 110 may be that of a substrate, a film, a layer, or the like. Moreover, the cross-sectional views described so far and the cross-sectional views which will be described below are intended to illustrate embodiments of the present invention concerning their structure, possible process flows and optional process variations. The cross-sectional views, however, are schematic representations and do not necessarily represent illustrations which are true to scale. Moreover, additional features, such as semiconductor structures comprising a processed area as described in the context of FIGS. 4, 5 and 6 or in other figures and parts of the present specification may also be implemented.

Figure 3:
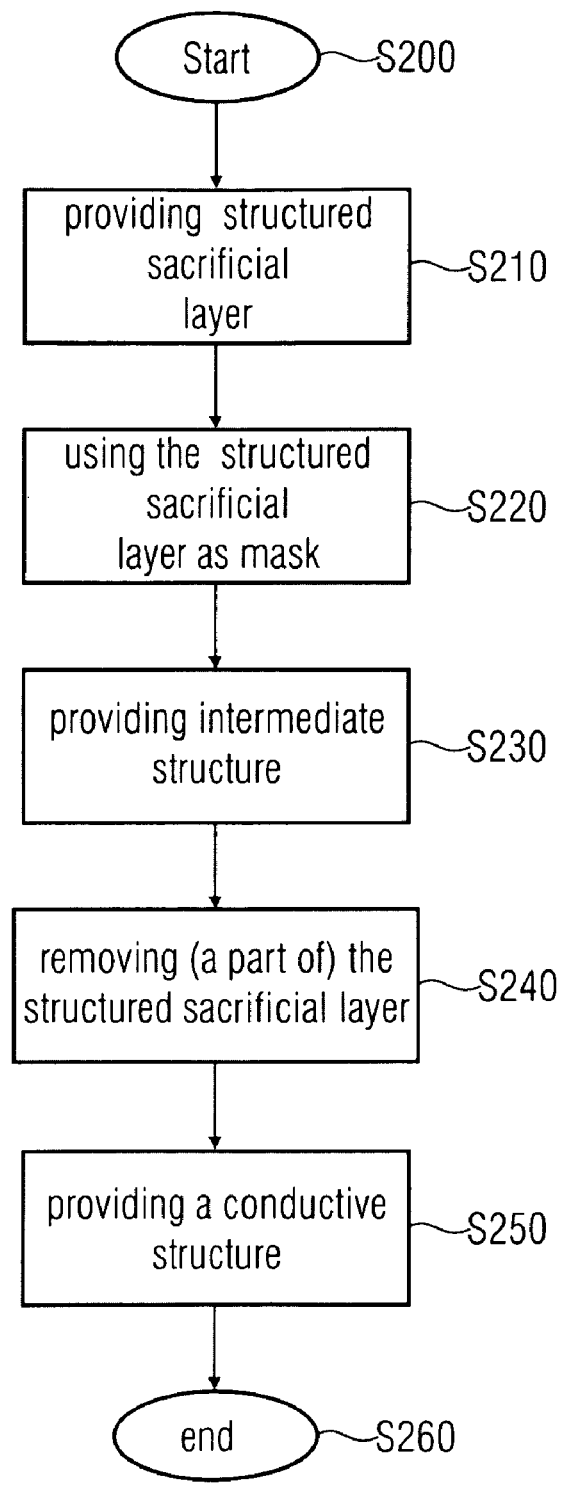
FIG. 3 shows a flowchart of a method for providing a self-aligned conductor structure according to an embodiment of the present invention.
Figure 4A:
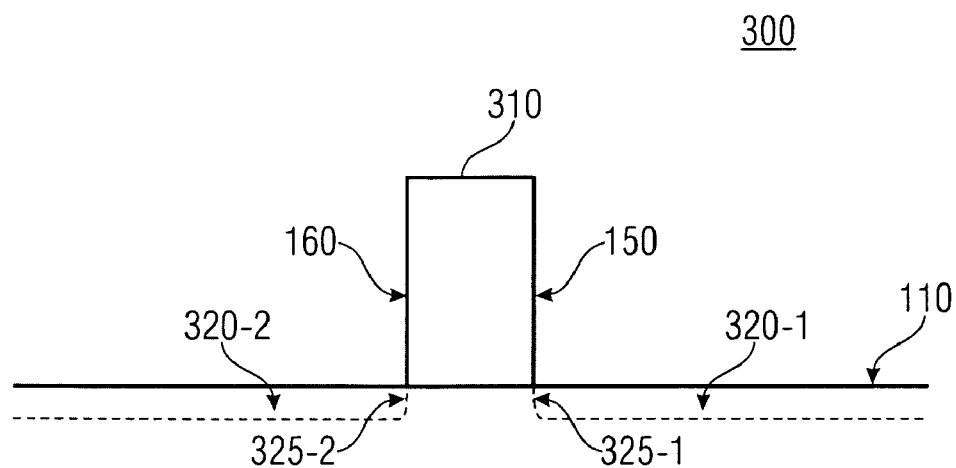
FIGS. 4a to 4d show cross-sectional views of a device, fabricated by employing a method according to an embodiment of the present invention, at different stages of the fabrication.
Figure 4B:
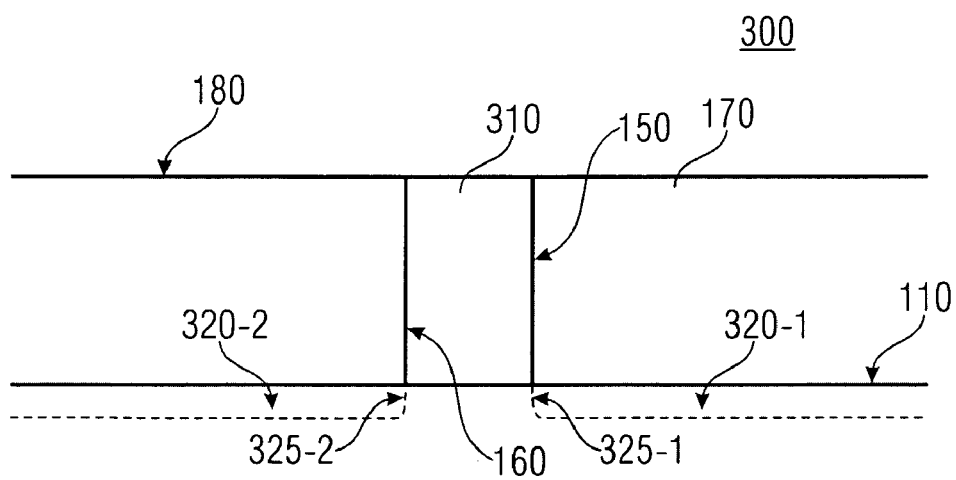

FIG. 3 shows a flowchart of a further embodiment according to the present invention in the form of a method for providing a self-aligned conductive structure 200. To illustrate and to describe the embodiment along with some options in more detail, FIGS. 4a to 4d show cross-sectional views of the corresponding device 300 at different stages. Finally, FIG. 4e shows a cross-sectional view of a device 300 fabricated according to a further embodiment of the present invention by employing two options, of which naturally also just one may be used.

After a start S200, shown in FIG. 3, in a step S210 a structured sacrificial layer 310 is provided on a surface 110, which may be that of a substrate, a layer, a film, or the like.

Providing the structured sacrificial layer may once again comprise depositing the corresponding material of the sacrificial layer by a chemical, physical or a combined chemical/physical deposition process, and by patterning the resulting layer to obtain the structured sacrificial layer 310 based on the previously described etching techniques. Naturally, other deposition techniques may also be employed, such as the previously described lift-off techniques.

In a step S220 the structured sacrificial layer 310 is used as a mask for one or more thin film process steps. Using the structured sacrificial layer 310 as a mask for processing the substrate of the device 300 leads to at least one processed area 320 beneath the surface 110. FIG. 4a shows two processed areas 320-1, 320-2, which may also be considered as sub-areas of a common processed area 320 comprising the areas 320-1, 320-2.

Using the sacrificial layer 310 as the mask may, for instance, comprise doping the substrate by means of ion implantation, etching processes, or other thin film process steps. FIG. 4a schematically shows the processed areas 320-1, 320-2 situated to the left and to the right of the structured sacrificial layer 310. The processed areas 320 may be doped areas such as a well arranged inside the substrate. Due to being at least partially based on the sacrificial layer 310, the processed areas 320-1, 320-2 each comprise a circumference 325-1, 325-2, respectively, which laterally at least partially corresponds to or conforms with a lateral position or a lateral width of the sacrificial layer 310 in terms of its edges 150, 160. In other words, areas 320-1, 320-2 each have a perimeter laterally at least partially conforming to a lateral footprint of the portion of the opening with the "footprint" denoting, for example, the projection in direction perpendicular to the lateral dimension.

In other words, in terms of a coordinate system having two axis parallel to the plane of the surface 110, lateral coordinates (i.e., coordinates parallel to the surface 110) of at least some points on the circumferences 325-1, 325-2 are essentially the same when compared to respective lateral coordinates of the sacrificial layer 310 and its edges 150, 160. In yet other words, considering a projection onto a plane essentially parallel or parallel to the surface 110, the circumference 325-1, 325-2 of the processed areas 320-1, 320-2 at least partially conform with the lateral positions or (lateral) coordinates of edges 150, 160 of the sacrificial layer 310.

Apart from being equal or essentially equal in terms of the lateral coordinates (i.e., coordinates in a plane parallel or essentially parallel to the surface 110), the processed areas 320 with their respective circumferences 325 may deviate from the lateral position or the lateral width of the sacrificial layer 310. This may be caused by processing steps or other fabrication-related steps. However, since the processed areas 320 are processed at least partially on the basis of the sacrificial layer 310, the lateral positions of at least parts of the circumference 325 of the processed area 320 conform with (or correspond to) the lateral position of the mask (sacrificial layer 310 with its edges 150, 160).

Hence, the processed area 320 may also extend into an area directly beneath the structured sacrificial layer 310 when the technique used involves a process leading to altering also the substrate in the masked area. Examples of these processes may comprise ion implantation along with a subsequent activation step (e.g., temperature step), leading to an extension or a dimension of the processed area 320 becoming larger than the area defined by the structured sacrificial layer 310. Due to diffusion processes, which may be initiated by exposing the device 300 to elevated temperatures, the doping area may extend to beneath the structured sacrificial layer 310, although direct bombardment of the area with ions was completely suppressed or at least significantly reduced during ion implantation by the very presence of the structured sacrificial layer 310.

After that, in a step S230 an intermediate structure 170 is provided on the surface 110. The intermediate structure 170 at least partially abuts a first lateral edge 150 of the structured sacrificial layer 310. In a cross-sectional view of FIG. 4b the intermediate structure 170 not only abuts the first lateral edge 150, but also a second lateral edge 160 of the structured sacrificial layer 310.

Moreover, as described in the context of the embodiments shown in FIGS. 1 and 2, the intermediate structure 170 and the structured sacrificial layer 310 may form a common surface 180. This may be achieved, as outlined before, by depositing a layer of the material of the intermediate structure 170 and reducing a thickness of the respective layer such that the common surface 180 of the intermediate structure 170 and of the structured sacrificial layer 310 is formed. Technologically, the previously mentioned processes may be used (e.g., lapping, polishing, CMP, IBE, or RIE).

In a step S240, at least a part of the structured sacrificial layer 310 which is adjacent to the first lateral edge 150 of the structured sacrificial layer 310 is removed. Removing the structured sacrificial layer 310 may be achieved by a selective etching process. Alternatives comprise dry etching processes as well as wet etching processes, which remove the structured sacrificial layer but leave the intermediate structure 170 essentially unchanged.

Figure 4C:
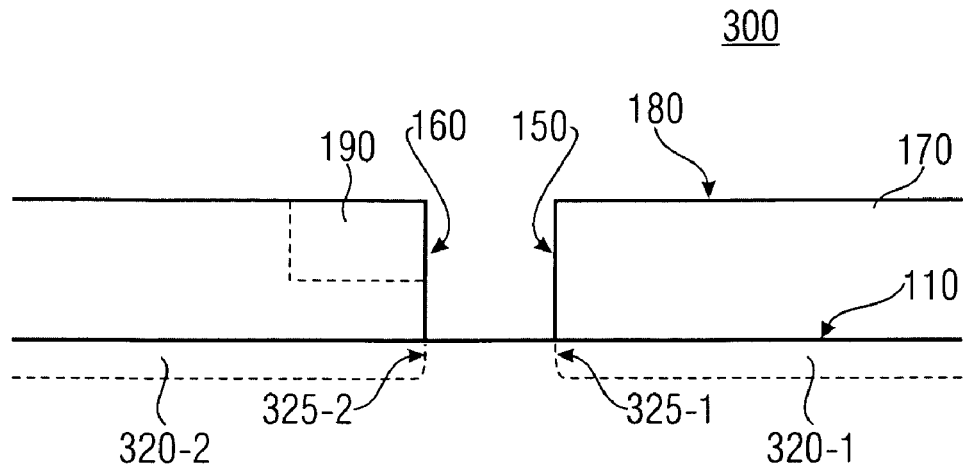

FIG. 4c shows a cross-sectional view of the device 300 in a stage in which the structured sacrificial layer 310 is completely removed. To achieve either partial or complete removal of the structured sacrificial layer 310, it might be advisable to implement the sacrificial layer and the intermediate structure 170 as having different material compositions, so that (material-) selective removal may be used here.

Due to forming the intermediate structure 170 in the described way and due to removing the sacrificial layer 310 at least partially in the described way, the edges 150, 160 will remain as those of the intermediate structure 170 essentially—eventually subjected to parasitic reactions—unchanged. Therefore, the arrangement of the edges 150, 160, parts of the circumference 325 of the processed area 320 as well as the opening created by selectively removing the material of the sacrificial layer 310 (step S240) is also essentially the same as previously described in context with the sacrificial layer 310. The previous description, hence, also applies here.

Similarly to the previously described method as illustrated in the context of FIGS. 1 and 2, the opening 190 may optionally also be generated inside the intermediate structure 170, so that the opening 190 is in immediate contact with the first lateral edge 150, the second lateral edge 160 or both lateral edges 150, 160 of the (formerly present) structured sacrificial layer 310. The lateral edges 150, 160 may be considered to be shared by the intermediate structure 170. Once again, in many embodiments according to the present invention a depth of the opening 190 is smaller than a height of the intermediate structure 170 and a height of the structured sacrificial layer 310. For more details, reference is made to the description of FIGS. 2*c* and 2*e*.

Figure 4D:
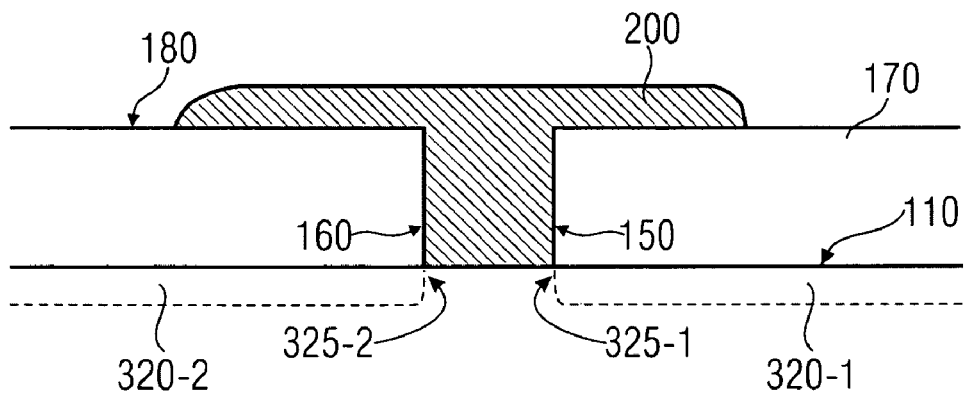
Figure 4E:
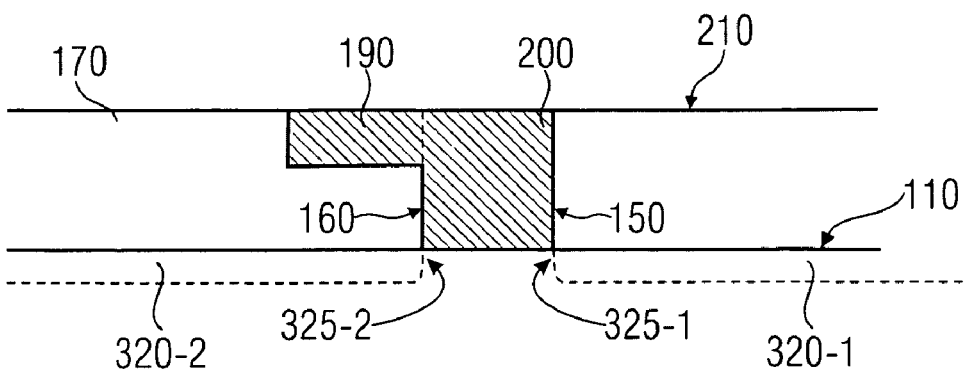
FIG. 4e shows a cross-sectional view of a device fabricated by employing a method according to a further embodiment of the present invention.

Before ending the method in a step S260, the conductive structure 200 is provided such that it replaces at least the removed part of the structured sacrificial layer 310, and abuts the first lateral edge 150. The conductive structure 200 may in this case completely fill the opening vertically, replacing the removed structured sacrificial layer 310 completely, so that the conductive structure 200 extends at least from the surface 110 to the common surface 180. The cross-sectional view shown in FIG. 4*d* illustrates the case in which the conductive structure 200 does not only fill the opening left by the structured sacrificial layer 310 up to the former common surface 180, but also extends beyond this surface. Concerning potential materials for the conductive structure 200, reference is made to the previous description.

The structured sacrificial layer 310 may comprise a material which allows feasible removal in view of the overall process flow. For instance, it may comprise an oxide (e.g., $SiO_2$), a nitride ($SiN_x$), an oxynitride (referred to as SiON), silicon (Si), polysilicon (Si), aluminum (Al), copper (Cu), gold (Au), tungsten (W), platinum (Pt), and silver (Ag).

FIG. 4*e* shows a cross-sectional view of the device 300 which is similar to the cross-sectional view of FIG. 2*e*. The device 300 of FIG. 4*e* is based on the same two optional modifications of the process described before. During step S240 of removing at least part of the structured sacrificial layer 310, the opening 190 is formed as well, so that during the step (S250) of providing the conductive structure 200, the corresponding material is also provided to the opening 190. As described before, the opening 190 may be used to extend an interface area of the conductive structure 200 to allow more reliable alignment of further structures to be deposited on top of it. Again, reference is made to the previous description concerning technical realizations.

Embodiments according to the present invention as described in the context of FIGS. 3 and 4 are based on the finding that by introducing the structured sacrificial layer 310, by using same as a mask to generate a processed area 320, and by at least partly replacing the sacrificial layer with the conductive structure 200, a self-aligned arrangement of the conductive structure 200 with respect to the processed area 320 may be achieved without having to introduce patterning steps which might increase the risk of a misalignment. This method according to an embodiment of the present invention, too, allows more flexible, more precise alignment of a conductive structure 200 with respect to the processed area 320, or a combination of both. One or more additional patterning steps, which might introduce the previously described misalignment, are rendered unnecessary by this method according to an embodiment of the present invention.

As will be described in more detail below, embodiments according to the present invention may be used to generate part of a gate electrode structure as the conductive structure 200 of a field effect transistor. In these cases, the methods according to embodiments of the present invention may be considered to be methods for providing a gate electrode structure of a transistor.

FIG. 5 shows a device 300 according to an embodiment of the present invention, which may be fabricated based on a method as described in context with FIGS. 3 and 4. The device 300 comprises an intermediate layer 170 on a surface 110. The intermediate layer 170 comprises an opening 400 extending to or towards the surface 110. The opening 400 comprises a portion 410 facing or abutting the surface 110, over which the opening 400 has a substantially constant or constant width. In other words, the portion 410, which is sometimes also referred to as the lower portion 410, comprises substantially vertical sidewalls with respect to the surface 110. The portion 410 may be equal to the entire height of the intermediate structure 170. In this case, the opening 400 extends to the surface 110. However, in the event that an opening 190 is implemented as shown in FIG. 5, the portion 410 only extends from the surface 110 to a height corresponding to a floor section of the opening 190, to name just one example. Hence, intermediate layer 170 comprises at least the portion 410 or the lower portion 410.

A metallic structure 420 completely fills the portion of the opening 400 laterally, and at least partially fills it vertically. In the event that an additional opening 190 is present, the metallic structure 420 may also fill this additional opening 190. The metallic structure 420 takes the place of the conductive structure 200 and can be considered to be identical to said structure 200 as described before, which, however, comprises a metal or an alloy.

As described in the context of FIGS. 3 and 4, beneath the surface 110 there is a semiconductor structure 430-1, 430-2 which has a lateral dimension or extension corresponding to or conforming with the lateral width of the (lower) portion 410 of the opening 400. Similar to FIG. 4, the semiconductor structures 430-1, 430-2 being processed areas comprise circumferences 435-1, 435-2, respectively. The semiconductor structures 430 with the circumference 435 essentially correspond to the semiconductor structure 320 with its circumference 325 as shown in FIG. 4. However, FIG. 5 shows the case, in which the semiconductor structures 430 extend underneath the opening 400 left, for instance, by selectively removing a sacrificial layer (e.g., sacrificial layer 310 in FIG. 4). Therefore, the opening 400 may be considered to comprise also the lateral edges 150, 160 as outlined in the context of FIGS. 1 to 4.

As outlined before, the semiconductor structure 430 may be, for instance, a doping area that also extends, at least partially, underneath the area of the opening 400 in the portion 410 facing the surface 110. As will be outlined in more detail below, such a processed area in the form of a doping area may form, for instance, source and drain regions of a field effect transistor. Moreover, the semiconductor structure 430 may also comprise or be formed by an etched region or any other processed area processed, for instance, during a semiconductor fabrication process step.

In such a case, lateral widths of the semiconductor structures 430 correspond to or conform with the lateral width of the portion 410 of the opening 400 in that the semiconductor structures 430, such as the doping areas 430, extend symmetrically with respect to a symmetry line 440 underneath the portion 410 of the opening 400. As shown in FIG. 5, a first lateral dimension or extension 450-1 extending from the symmetry line 440 to a beginning of the semiconductor structure 430-1 is more or less identical to a lateral dimension or extension 450-2 extending from the symmetry line 440 to a beginning of the semiconductor structure 430-2. In other words, the circumferences 435-1, 435-2 of the semiconductor structures 430-1, 430-2, respectively, laterally at least partially correspond to the lateral position of the opening 400, its edges 150, 160 or the lateral width of the opening 400.

In different embodiments according to the present invention, there may also be other geometrical arrangements of the semiconductor structure 430 comprising the processed area which correspond to the lateral width of the portion 410 of the opening 400. For instance, the semiconductor structure 430 may end at the boundaries of the portion 410, or may even symmetrically end outside the area of the portion 410. This may be the case when a more complex doping structure is implemented underneath the surface 110.

Optionally, the opening 400 in the intermediate structure 170 may comprise a further layer which is in contact with the surface 110 and which is not shown in FIG. 5. This optional layer may be considered to be the first layer 130 or—in the event of a combination of the two methods according to embodiments of the present invention described before—to be part of the second layer 140. This optional layer may also be part of the structured sacrificial layer 310 if it is not completely removed during step S240.

Devices 300 according to embodiments of the present invention may be recognizable since these devices may comprise metal, which is deposited into the opening or trench 190. Within said opening or trench 190, the metal 200 replaces a sacrificial layer which has been removed. This, however, may be detectable by the presence of a Ti/TiN barrier or a similar metal deposited onto the sidewalls and the bottom of the trench without any mismatch or misalignment in the overlay. Devices 300 may therefore be recognizable by means of a simple SEM analysis.

FIG. 6 shows a further device according to an embodiment of the present invention in the form of a field effect transistor 300, which may be fabricated using one of the methods according to an embodiment of the present invention as previously described. The field effect transistor 300 comprises a substrate 500 with a surface 510 which has an insulating layer 520 deposited thereon. The insulating layer 520 may be an oxide, such as silicon oxide or silicon dioxide.

The substrate 500 further comprises a first doping area 530-1 and a second doping area 530-2 beneath the surface 510 of the substrate. The first and the second doping areas 530-1, 530-2 are laterally spaced apart by a channel area 540. The first doping area 530-1 and the second doping area 530-2 may correspond to the semiconductor structures 430 as previously described. As a consequence, the doping areas 530-1, 530-2 also comprise corresponding circumferences 535-1, 535-2, respectively, the lateral positions, dimensions or widths of which conform with a lateral width or position of lateral edges 150, 160 of the opening 400, as outlined above in the context of FIGS. 4 and 5. The insulating layer 520 is deposited onto the surface 510 of the substrate 500 such that it covers at least the channel area 540. However, in FIG. 6 it covers a wider area.

The field effect transistor 300 further comprises an insulating structure 170 on the surface 510 of the substrate 500. As the cross-sectional view of FIG. 6 shows, the insulating structure 170 is deposited on the surface 110 of the insulating layer 520.

The insulating structure 170, which may be the intermediate structure 170 of a method described before, comprises an opening 400 having at least a portion 410 which faces the surface 110 and with which comprises the constant lateral width as described in the context of FIG. 5. The portion 410 is symmetrically arranged with respect to a dimension (extension) of the first and the second doping areas 530-1, 530-2 underneath the portion 410 of the opening 400. To illustrate this, FIG. 6 shows a symmetry line 440 along with two arrows indicating lateral dimensions (extensions) 450-1, 450-2 between the starts of the doping areas 530-1, 530-2, respectively, and the symmetry line 440. In the case of a symmetric arrangement, the lateral dimensions (extensions) 450-1, 450-2 are more or less identical.

The field effect transistor 300 further comprises a metallic structure 420, which completely fills the portion 410 laterally, and at least partially fills it vertically. In the case shown in FIG. 6, the metallic structure 420 fills the opening 400 completely, including an optional opening 190 which extends a contact area or interface area of the metallic structure 420, as described before. The metallic structure 420 and the intermediate structure 170 form a common surface 210 as described in the context of FIGS. 1 to 4.

Optionally, the opening 400 in the intermediate structure 170 may comprise parts of the structured sacrificial layer 310, the first layer 130 or parts of the second layer 140 depending on the method involved in the fabrication of the field effect transistor 300 according to embodiments of the present invention. Hence, the metallic structure 420 is not required to fill the portion 410 or the entire opening 400 vertically. To illustrate this, FIG. 6 shows an optional layer 550 inside the opening 400 at the surface 110, which an optional layer 550 may comprise any of the previously mentioned layers 130, 140, 310 or parts thereof.

As the embodiment described directly above has already shown, embodiments according to the present invention may be used in the field of gate architectures for transistors, such as field effect transistors. However, before describing self-aligned, fully metallized gate architectures produced by means of a sacrificial layer according to an embodiment of the present invention in more detail, a more general description of a LDMOS transistor (LDMOS=laterally diffused metal oxide semiconductor) will be given first, since the semiconductor structures underneath the surface of the respective substrates will not be shown in FIGS. 8 and 9 for the sake of simplicity.

FIG. 7 shows a LDMOS transistor with the substrate 500, which is a highly p-doped substrate ($p^+$). The substrate 500, which is sometimes also referred to as a bulk material, comprises a weakly doped epitactical layer 600, which also comprises a p-doping, next to a surface 510. Accordingly, the epitactical layer 600 is sometimes also referred to as "p-epi".

Inside the epitactical layer 600 a p-doped well 610 is provided, which extends up to the surface 510 of the substrate. It is laterally limited by a highly p-doped deep well 620, which is sometimes also referred to as the "sinker" or as "deep $p^+$". The sinker 620 penetrates the epitactical layer 600, allowing direct, low resistance contact with the bulk material of the substrate 500. It extends from the surface 510 into the substrate 500 and is in contact with the source metallization 630 of the LDMOS transistor.

Directly underneath the surface 510 of the substrate 500, the LDMOS transistor comprises a highly n-doped well 640 forming the source terminal of the LDMOS transistor. The source terminal 640 in the form of an $n^+$-doped well is arranged completely inside the p-doped well 610 and the sinker 620. Parallel to the surface 510 of the substrate 500, the source terminal 640 abuts a channel area 540 inside the p-doped well 610. In the channel area 540, an inversion channel of the LDMOS transistor is formed during its operation.

The channel area 540 itself abuts, opposite to the source terminal 640, a drain terminal 650 in the form of a weakly n-doped well ($n^-$). The drain terminal 650 extends partially into the p-doped well 610 and thus forms the body of the LDMOS transistor, and extends into the epitactical layers 600. As an optional well, the drain terminal 650 may be in contact with a highly n-doped well 660 ($n^+$). The drain terminal 650 is also arranged directly underneath the surface 510 and is in contact with a drain metallization 670. It may offer the possibility of reducing a resistance value of the drain terminal 650 by substituting it partially.

The drain metallization 670 and the source metallization 630 on the surface 510 of the substrate 500 are separated and electrically insulated from one another by an insulating structure 680 comprising an insulating layer 520. The insulating structure 680 also covers at least the surface 510 of the substrate 500 on top of the channel area 540. The insulating layer 520 may comprise silicon dioxide, silicon oxide, or other insulating materials. A gate electrode structure 690 is arranged on top of the insulating layer 520, over the channel area 540, but inside the insulating structure 680.

The gate electrode structure 690 may comprise any electrically conductive material such as a semiconductor, a metal, a combination of both, or the like. For instance, in the event of a method according to an embodiment of the present invention which is used for fabricating the LDMOS transistor, the first layer 130, the second layer 140, or the conductive structure 200 may be part of the gate electrode structure 690.

The LDMOS transistor shown in FIG. 7 utilizes an epitactical silicon layer 600, weakly doped p-type layers (e.g., p-doped well 610) on a low-resistivity silicon wafer 500. In other words, the silicon wafer 500 itself is highly doped. As an alternative to the diffused sinker 620, a trench etched through the epitactical layer 600 may be used to ground the source metallization 630 to the substrate 500.

The LDMOS transistor shown in FIG. 7 may also be implemented in its complementary doping. In other words, a LDMOS transistor may be implemented by exchanging the p-doped areas and wells with n-doped areas and wells, and vice versa. Also, the doping concentration may naturally be varied.

For the sake of completeness, it should be noted that the structure shown in FIG. 7 is referred to as a laterally double diffused MOS transistor (LDMOS), since the p-doped well 610 and the two terminals 640, 650 are separately diffused underneath the gate electrode structure 690.

During the operation, the LDMOS transistor uses the inversion channel at the silicon oxide interface in the channel area 540 underneath the surface 510. The inversion channel is induced underneath the gate electrode structures 690 by a corresponding positive gate potential. Under practical relevant conditions, the inversion channel only exists over the laterally diffused p-doped well 610, which is sometimes called depletion stopper. As the electrons leave the region over the stopper, they are picked up by the electric field due to the positive drain bias, and leave the inversion channel behind while going deeper into the bulk. The effective gate length defines the lateral dimension (extension) of the stopper layer. It may therefore be shorter than the physical length of the gate electrode.

As will be outlined in more detail in context with FIGS. 8 and 9, LDMOS transistor designs may also comprise a field plate which overlaps the thick dielectric of the insulating structure 680 over the gate electrode structure 690. The field plate provides additional shielding of the gate from the drain potential during operation. The combined action of the stopper and the field plate may be able to minimize the feedback capacitance or the drain-gate capacitance, which may lead to a further improvement concerning RF signals (RF=radio frequency).

In the field of transistor technology, the previously described need to improve alignment is furthermore triggered by the ever-present tendency to miniaturize transistors further. For increasingly small gate features, the gate line resistivity of the gate electrode structure 690 should be low enough to improve the overall transistor performance. Self-aligned gates formed by silicidation of the polysilicon gate line with metal may often be limited by the resistivity of the gate line and the materials used for silicidation. For instance, titanium silicide (TiSi) comprises typical specific resistivity values of about 13 μΩcm.

Due to the high temperatures required for the lateral diffusion processes to drive the p-well 610 for the channel below the gate electrode structure 690, the metal-silicide has to be fabricated and realized afterwards. During the diffusion processes temperatures of more than 1000° C. may have to be applied to the transistor for several 10 minutes. Typical values may comprise a temperature of 1025° C. for 60 minutes.

Increasing the silicide thickness ratio up to full silicidation of the polysilicon structure of the gate electrode structure 690 may also lead to further problems in many cases. The material conversion during silicidation may generate a high level of in-film-stress which is increased with increasing silicide thicknesses. Stress in the gate structures of corresponding devices may, however, lead to a de-lamination of the silicide from the polysilicon. Problems like leakage and resistance variations may be the consequence. Hence, increasing the thickness of the gate electrode structure may eventually lead to reliance problems.

Figure 8F:
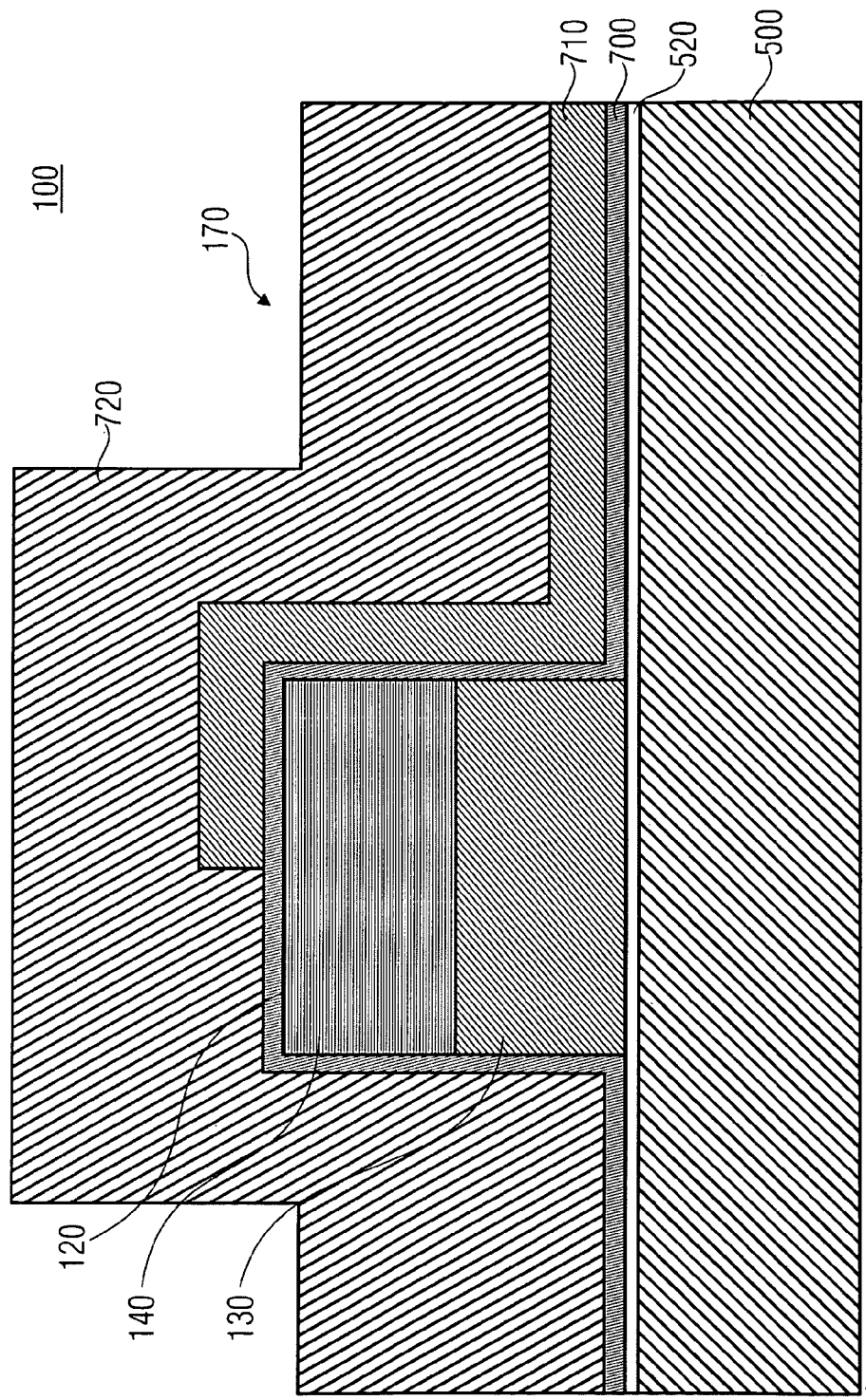
Figure 8G:
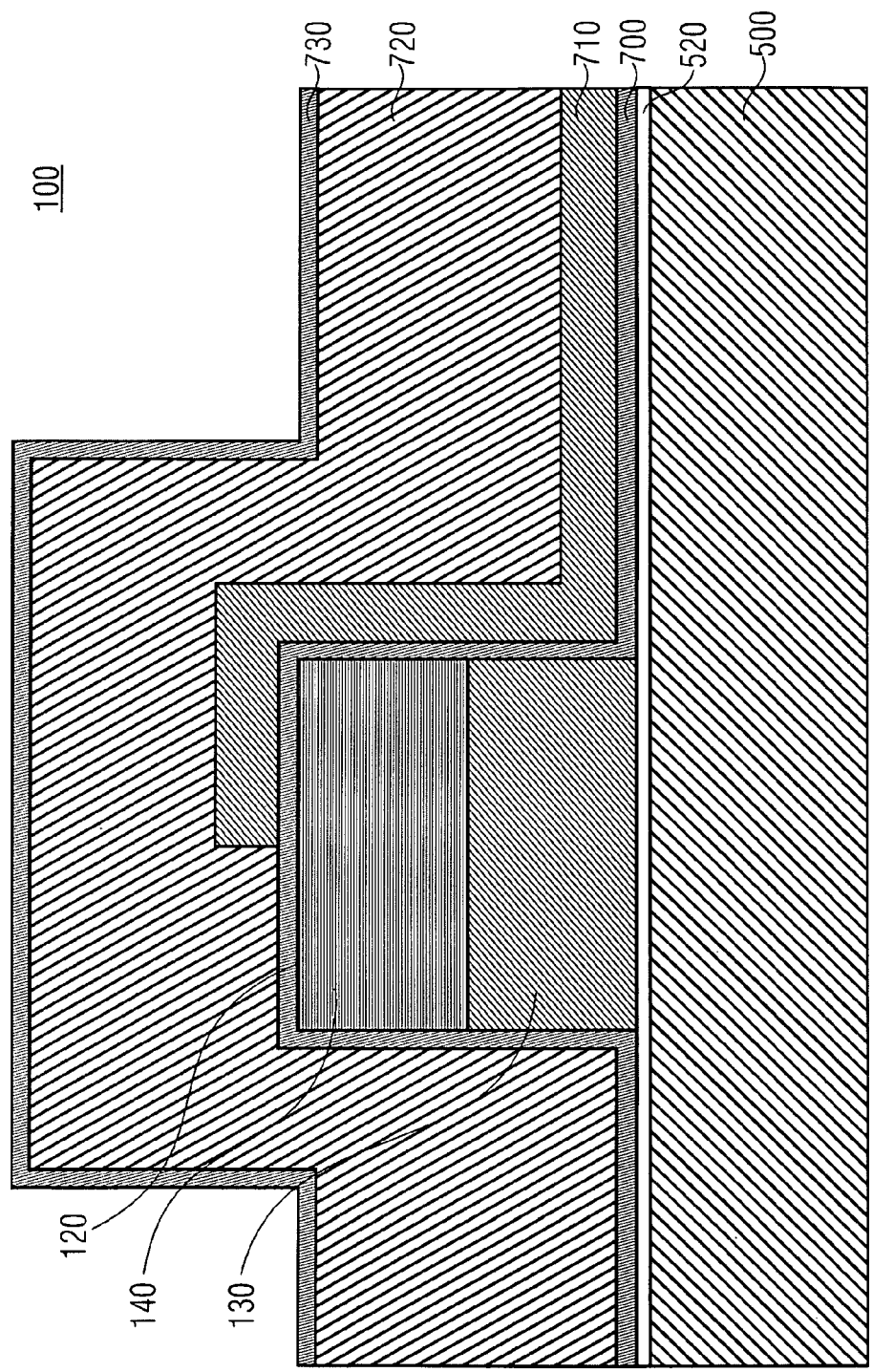
Figure 8I:
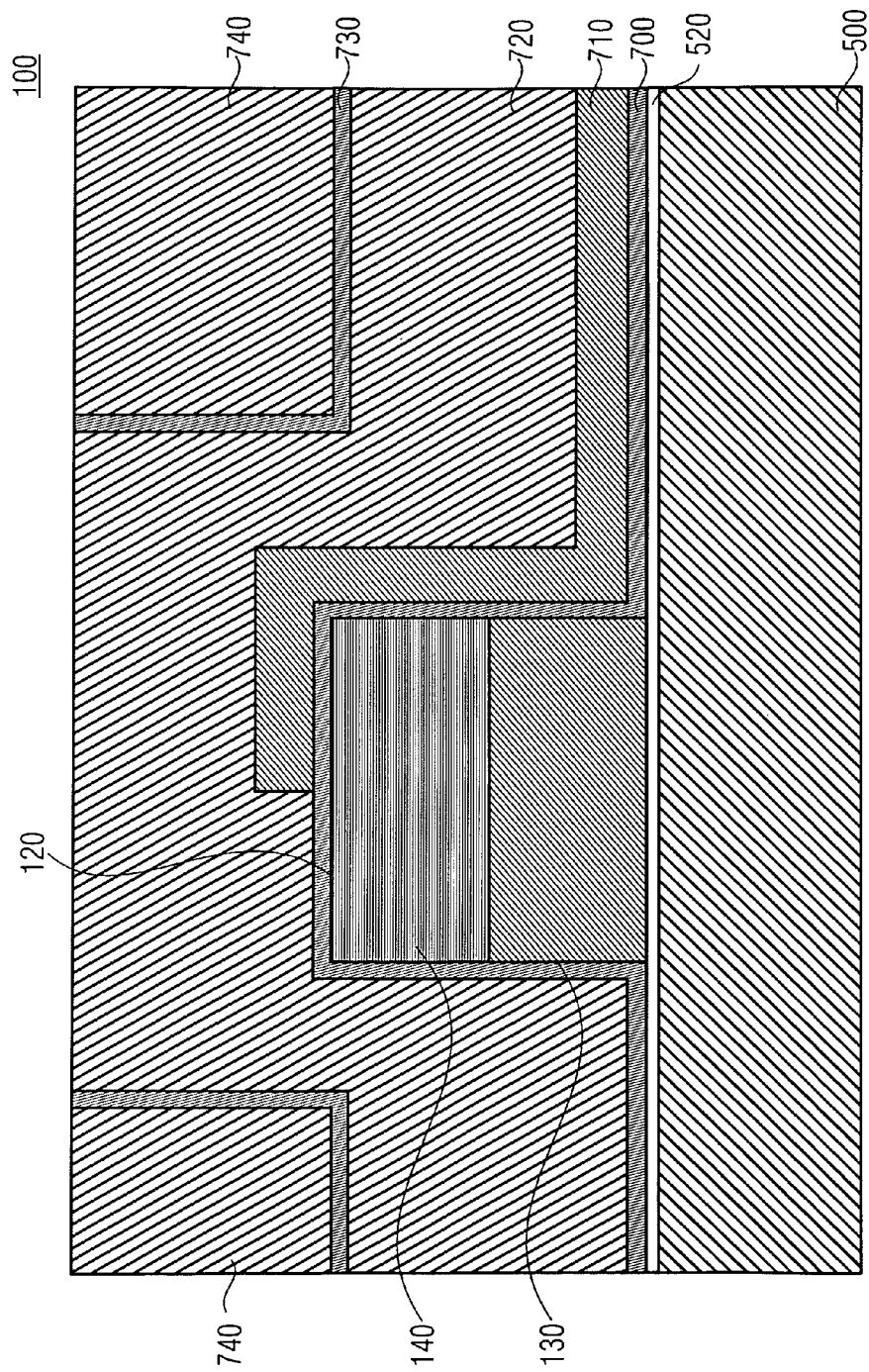
Figure 8J:
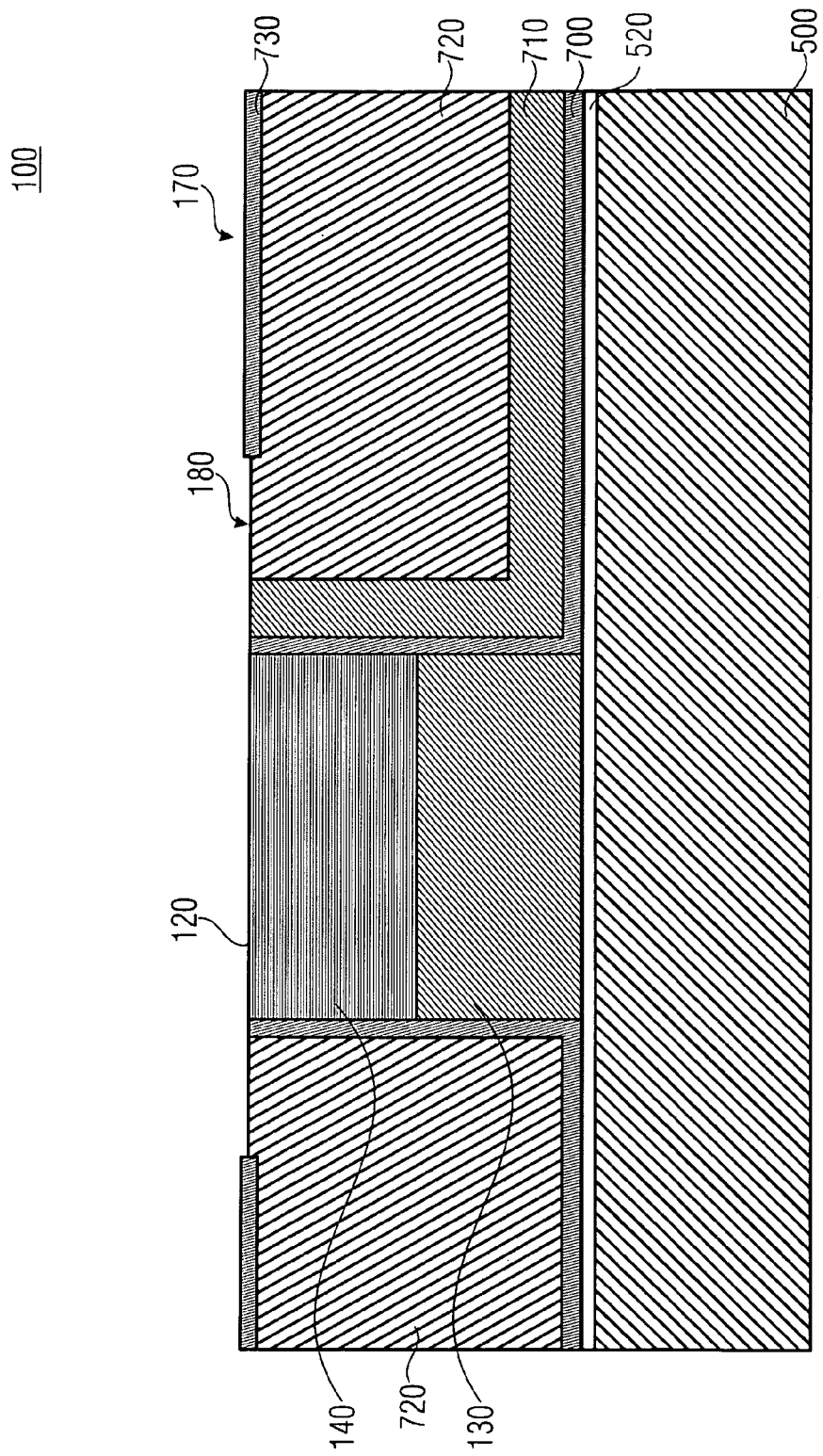
Figure 8K:
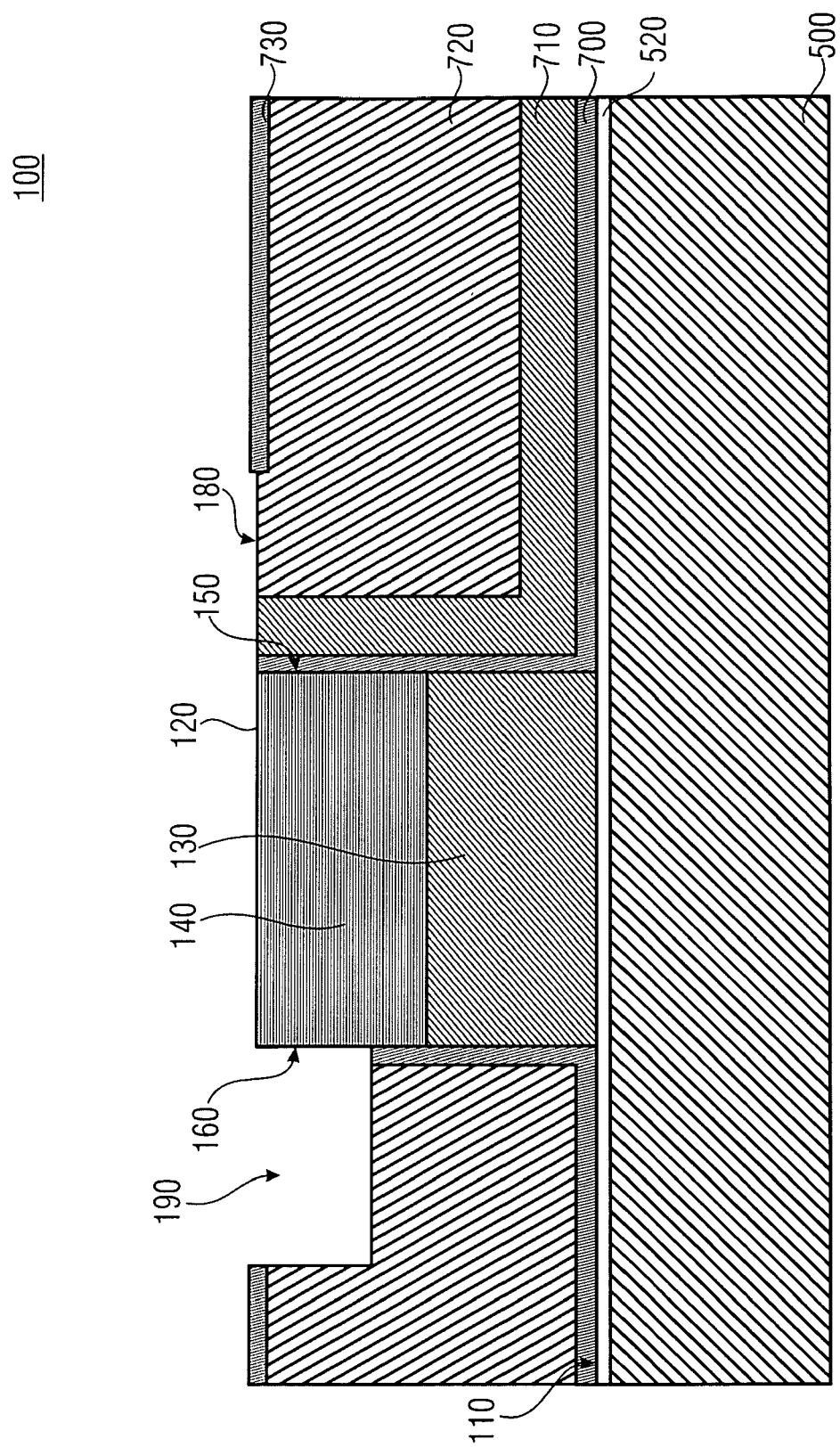
Figure 8L:
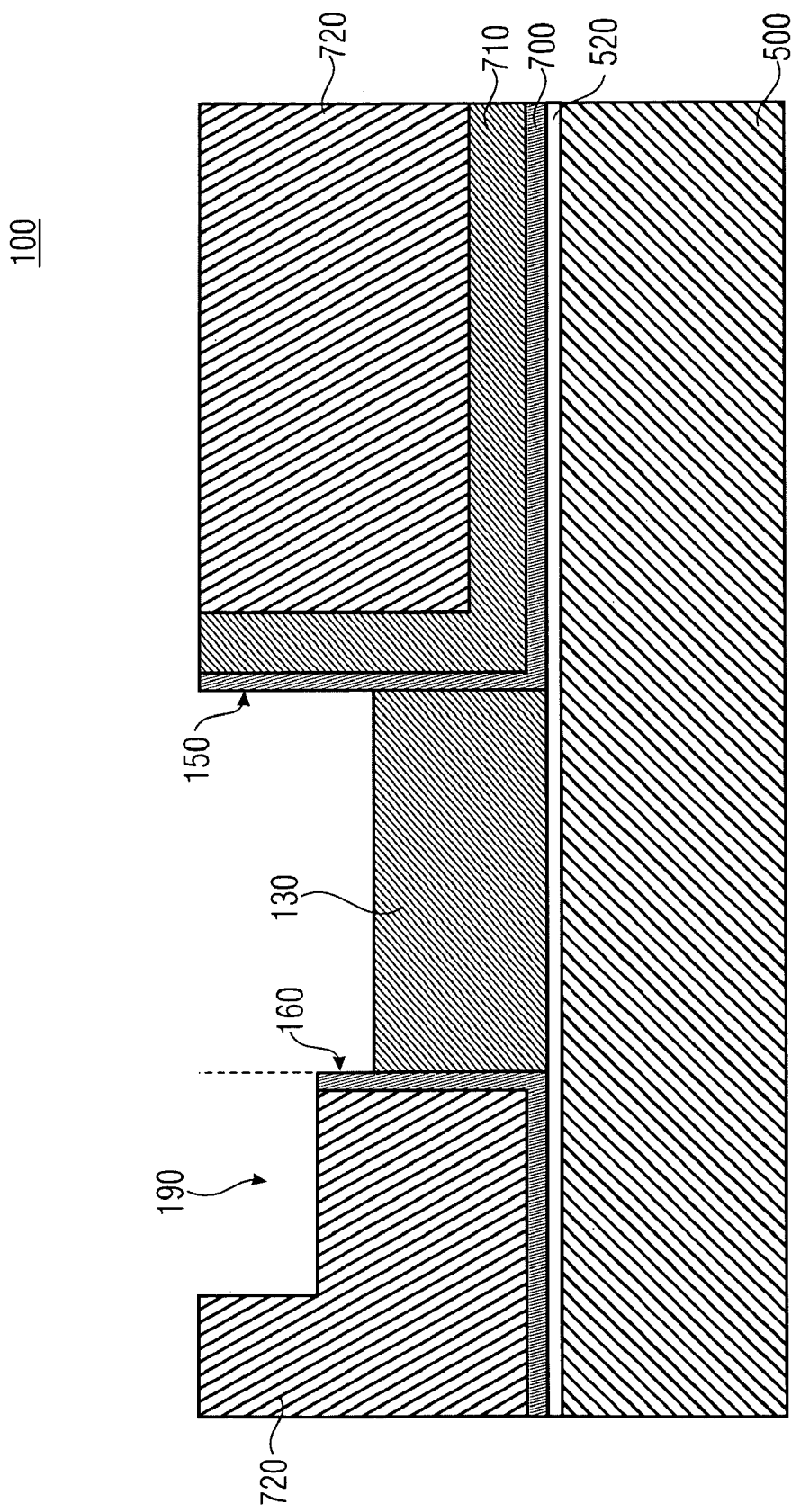
Figure 8M:
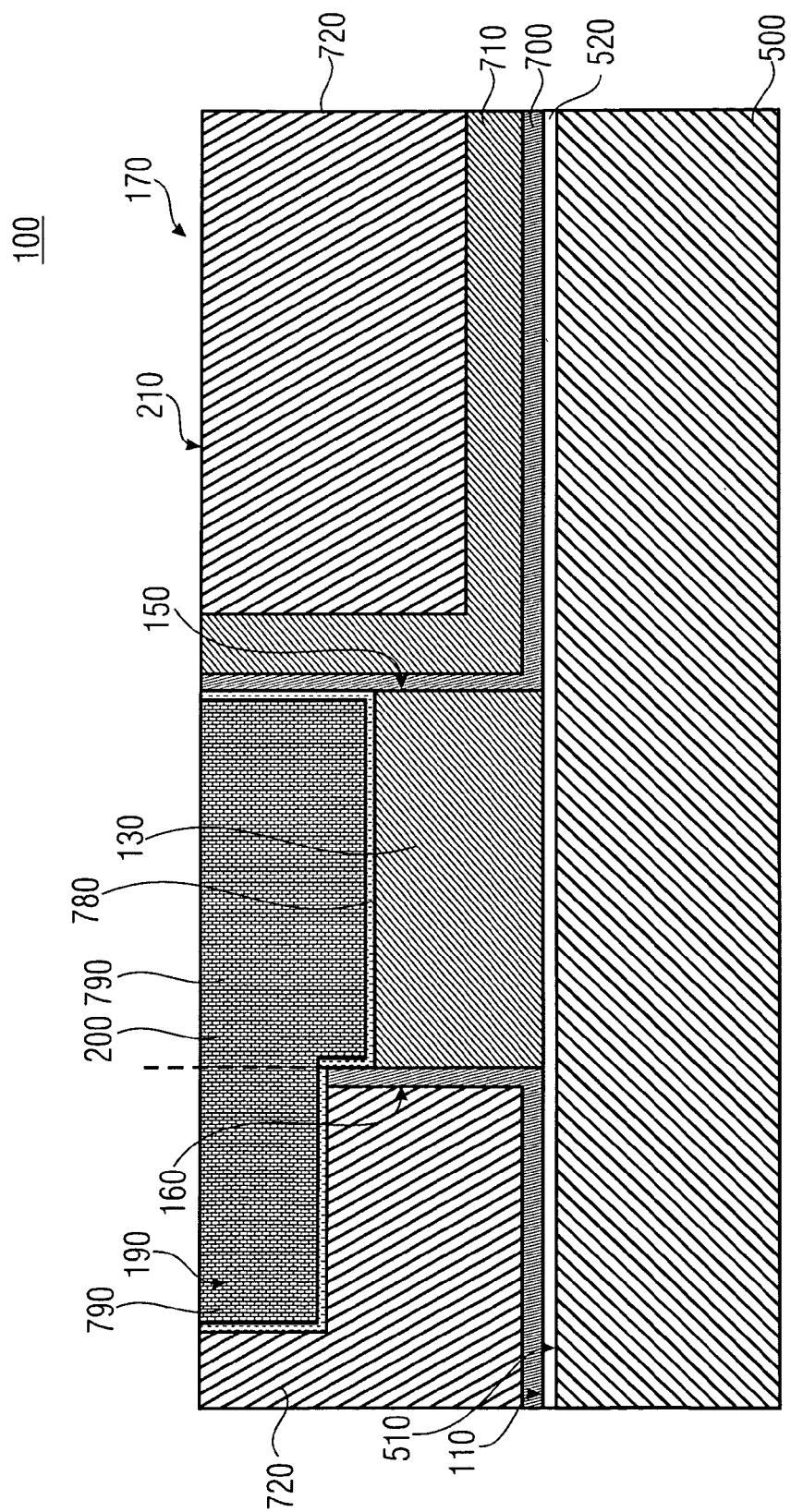
Figure 8N:
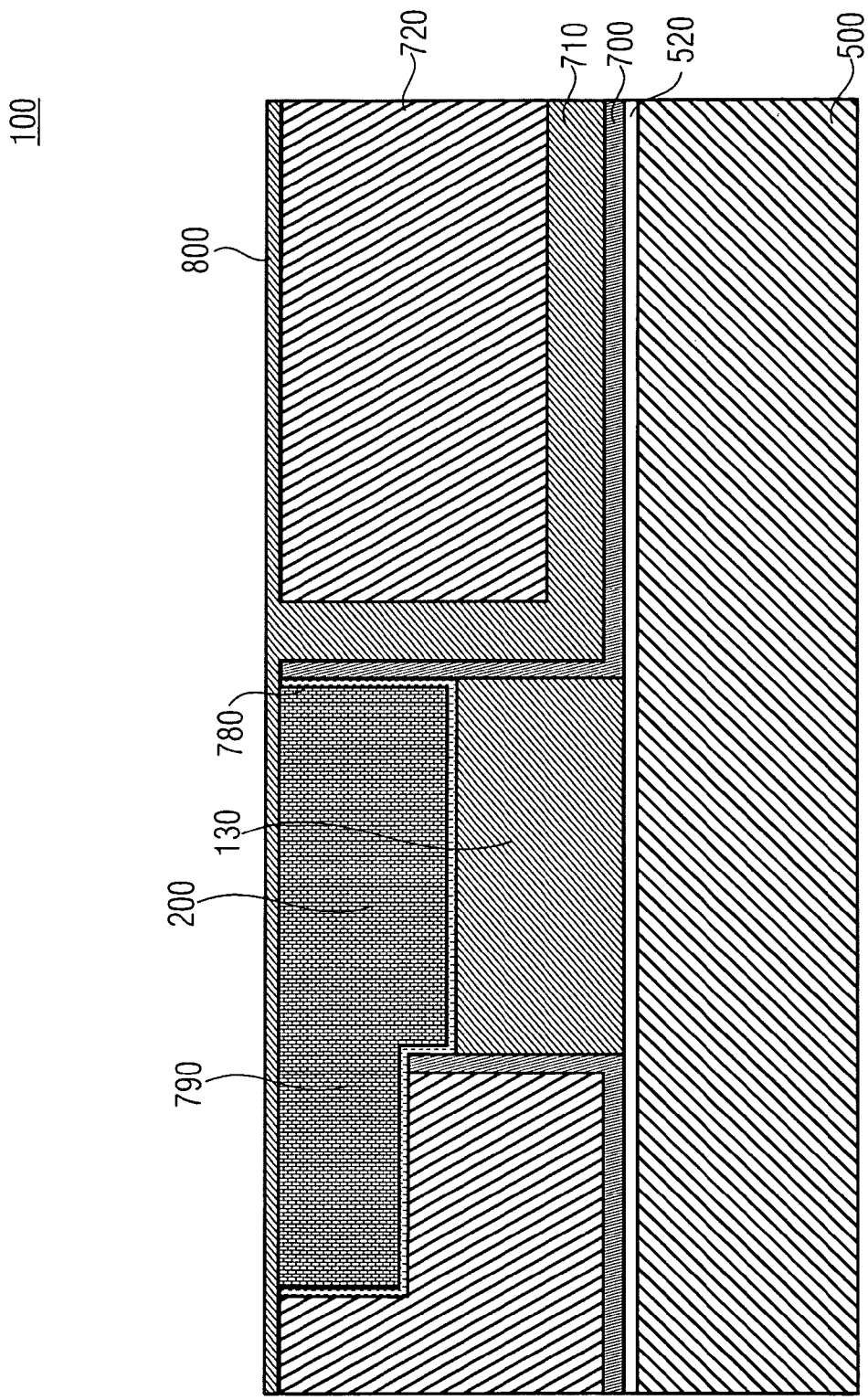
Figure 80:
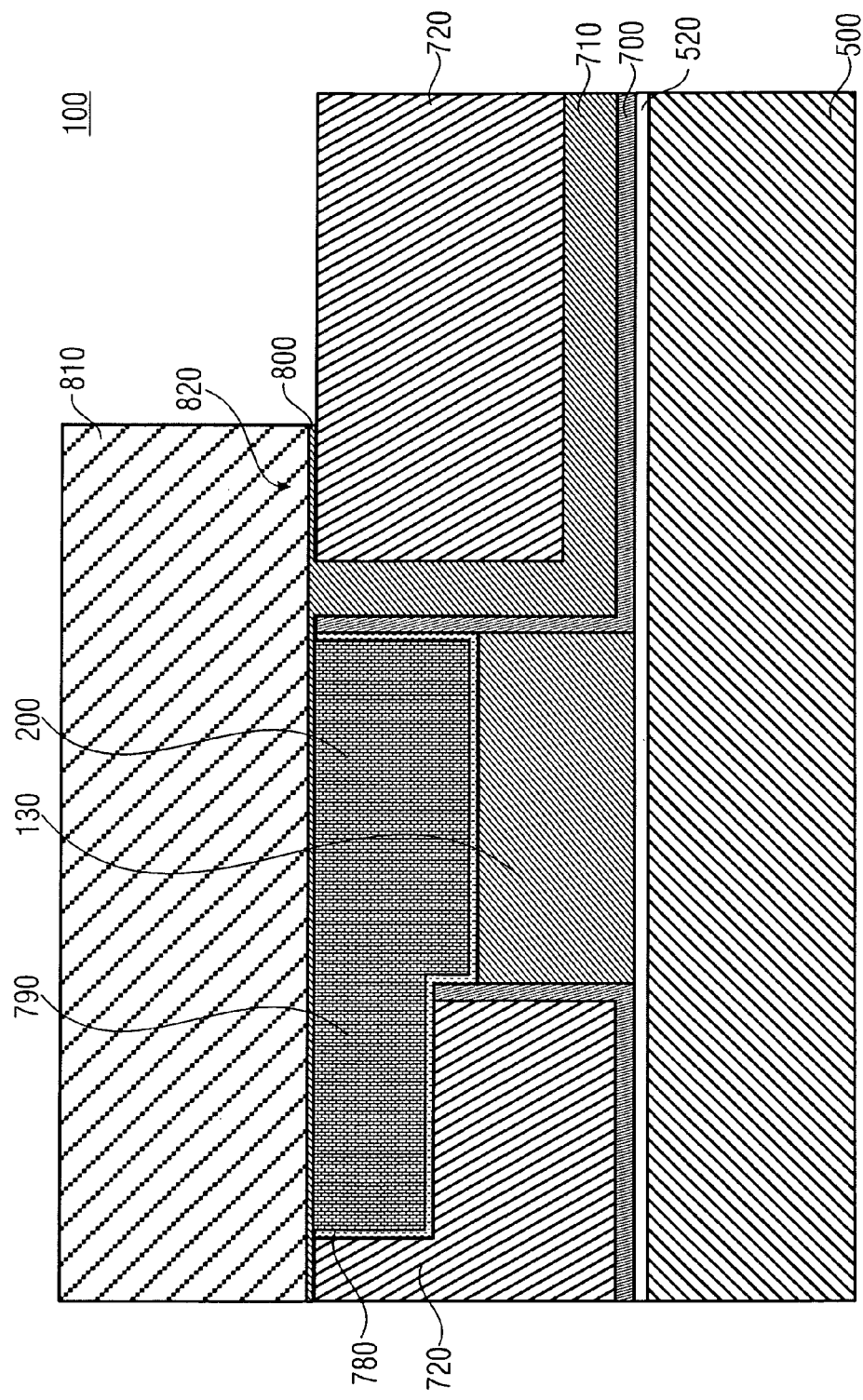
Figure 8P:
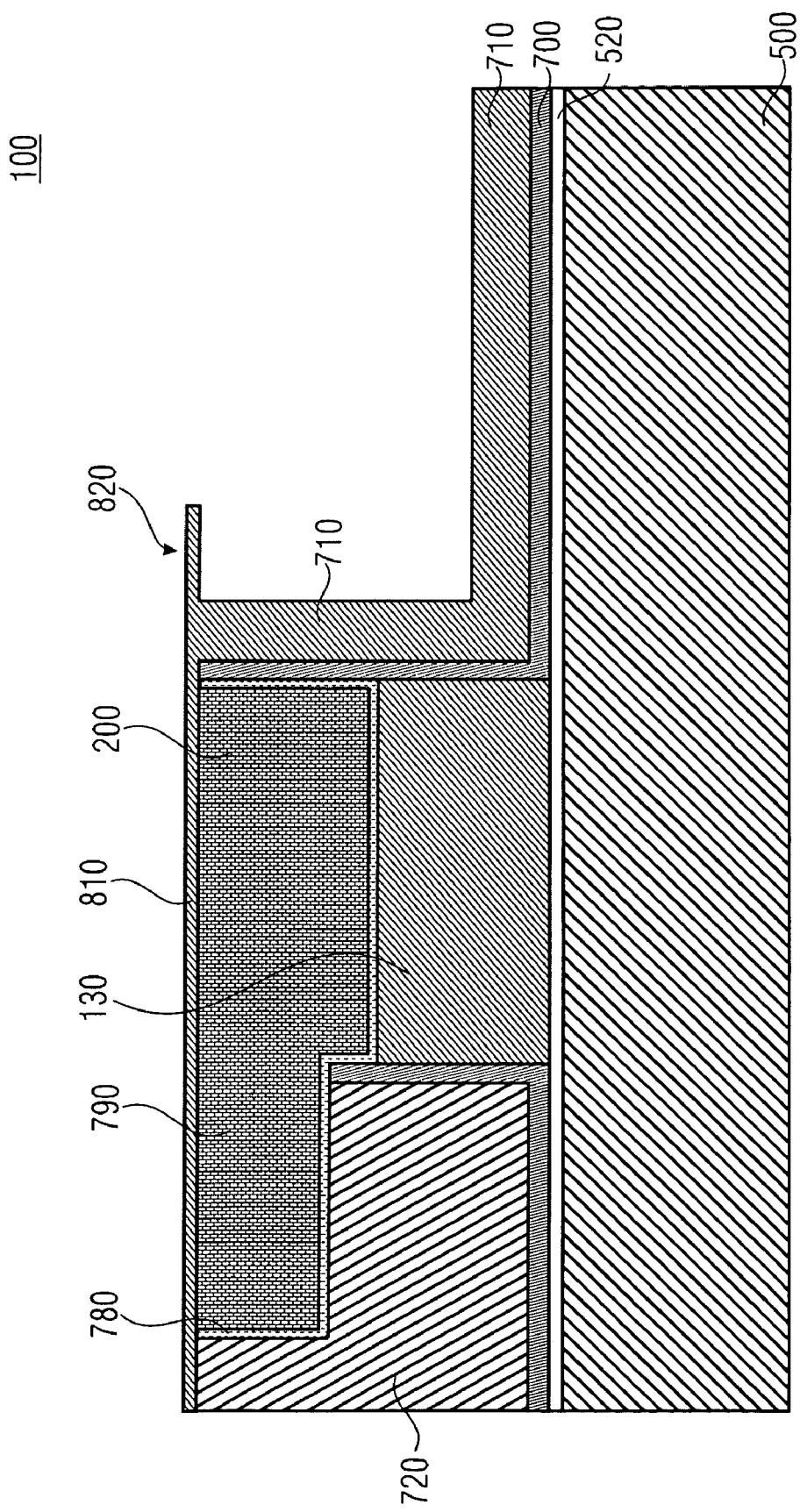
Figure 8S:
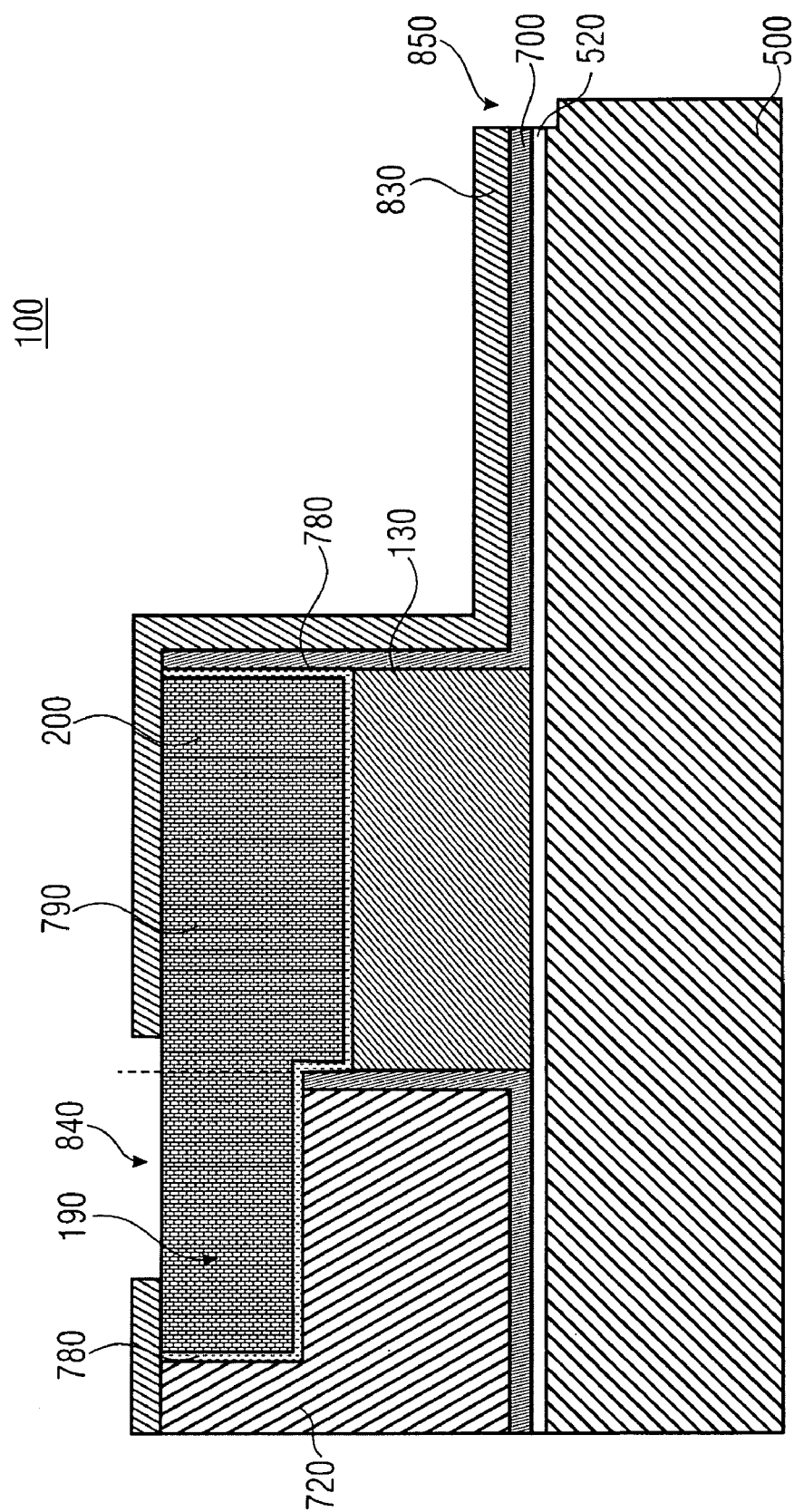
Figure 8T:
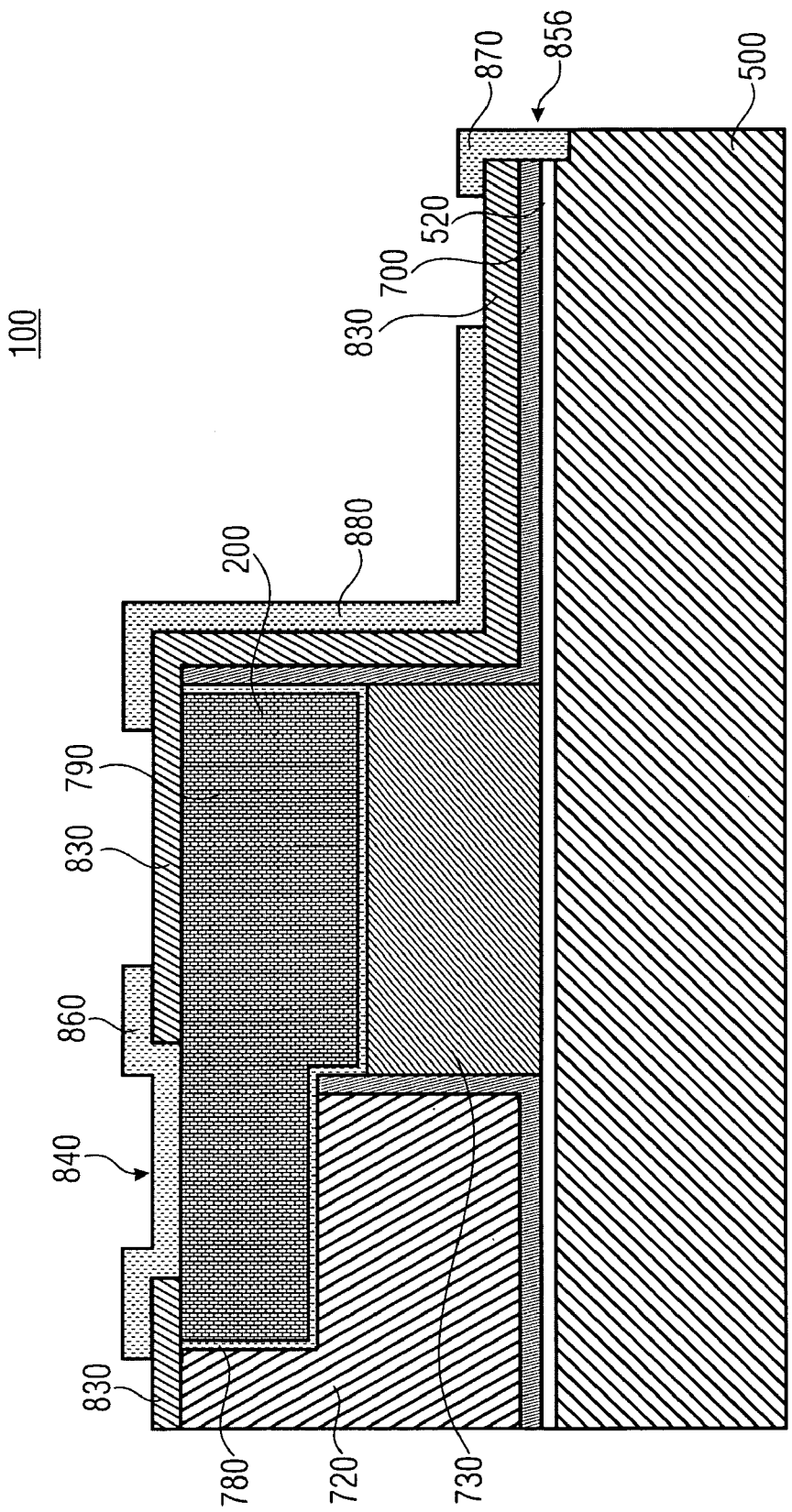
Figure 8U:
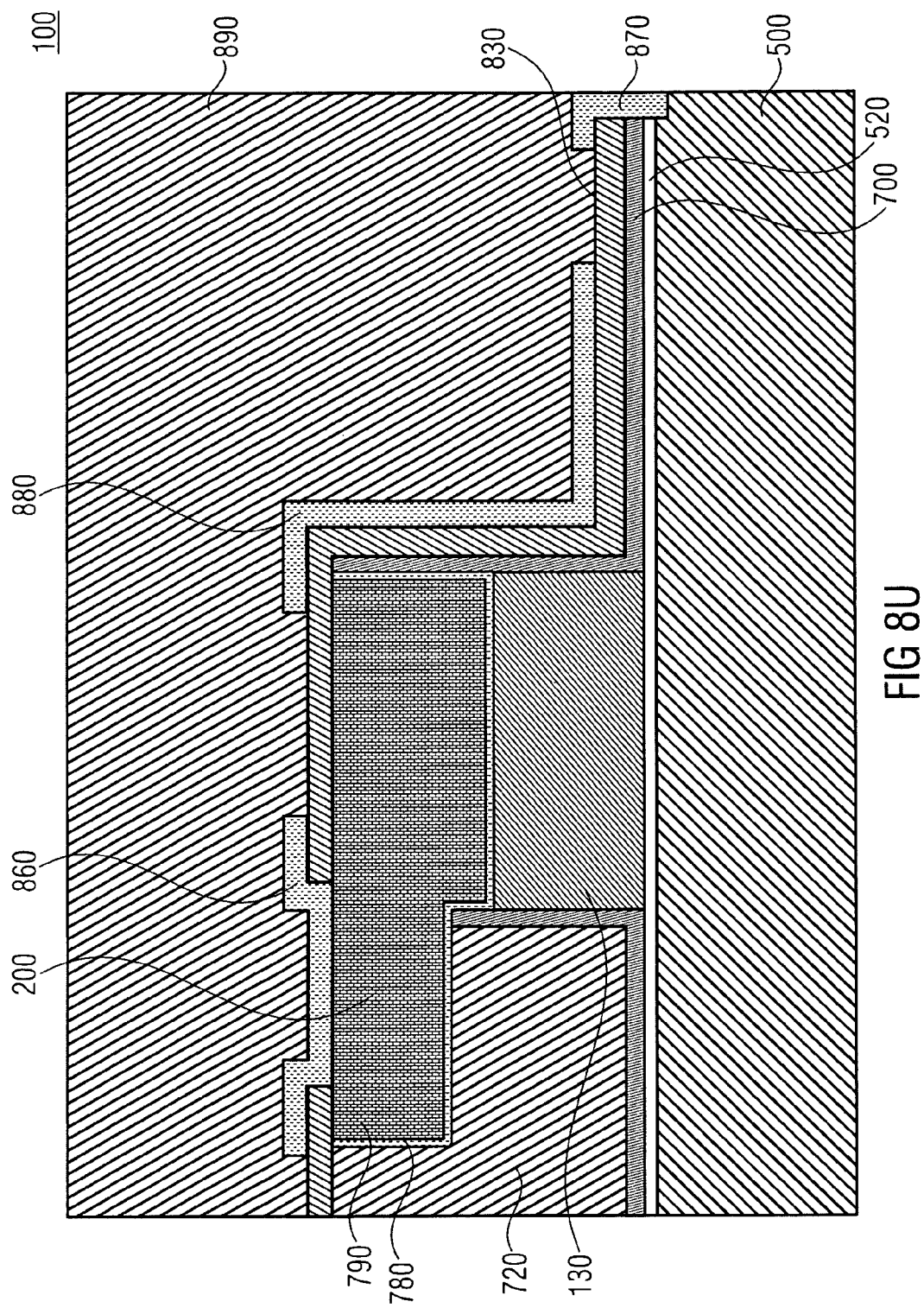

FIGS. 8a to 8u show cross-sectional views of a LDMOS transistor illustrating an implementation example of the previously described methods according to embodiments of the present invention. The LDMOS transistor shown in FIGS. 8a to 8u is a transistor of the voltage class of 60 V. Naturally, embodiments according to the present invention may also be implemented in different voltage classes as well as within different devices.

As will become apparent, the embodiment shown and described in context with FIG. 8a to 8u, too, is based on a replacement of a sacrificial layer on top of a gate line to form a self-aligned metal line on top of a polysilicon gate line, sometimes also referred to as the gate poly line. In a further embodiment according to the present invention, a fully metallized gate electrode structure will be generated without a polysilicon gate line.

The process described next is based on the fact that a sacrificial layer (e.g., silicon nitride (SiN)) on top of a polysilicon layer is often capable of withstanding high temperature processes, such as a channel drive-in process. Hence, the sacrificial layer is used in a front end part of the overall process and stays in place until it is replaced by metal. It may be combined with a dual damascene architecture to form a gate tap connection which is not directly situated over and is not in direct contact with the active gate area. In many cases, the resistivity of a pure metal line on top of the polysilicon is 2 to 5 times lower than the resistivity value of a metal silicide like titanium silicide (TiSi) or nickel silicide (NiSi).

FIG. 8a shows a cross-sectional view of a device 100 comprising a substrate 500 on top of which an insulating layer 520, for instance an oxide, is deposited. The insulating layer 520 may be generated by thermal oxidation of silicon of a silicon wafer typically used as the substrate 500. Alternatively or additionally, the oxide layer as the insulating layer 520 may also be deposited by TEOS or any other deposition technique.

On top of a surface 110 of the insulating layer 520, which does not coincide with the surface 510 of the substrate 500 in this case, a first structure 120 comprising a first layer 130 and a second layer 140 is provided. The first layer 130, which will become part of the gate electrode structure 690, is made of n-doped polysilicon. On top of the first layer 130, the second layer 140 may comprise oxynitride, which is sometimes also referred to as SiON, or alternatively a nitride such as silicon nitride. Alternatively, to stop selectively at layer 130 an additional thin layer like SiO or SiN may be incorporated between layer 130 and 140, which will be outlined later in more detail.

The first structure 120 may be fabricated by depositing the first layer 130 and the second layer 140 by subsequent patterning and milling or patterning and etching steps. In case of oxynitride layers, these may be fabricated by (thermal) oxidation of silicon nitride ($Si_3N_4$) or, alternatively, by vapor deposition.

Hence, FIG. 8a shows the cross-sectional view of the device 100 after deposition of polysilicon for the gate and the oxidized silicon nitride on top of the polysilicon structure, and after a first patterning step using a reticle for the gate features. Due to the patterning, the first structure 120 comprises a first lateral edge 150 and an opposite second lateral edge 160, to which both the first layer 130 and the second layer 140 extend laterally. The common edges 150, 160 of the two layers are a consequence of a subsequent deposition and simultaneous patterning and etching of both layers.

In other words, a layer of polysilicon (layer 130) and a sacrificial layer (layer 140) are deposited on top of a gate oxide (layer 520). The polysilicon and the sacrificial layers are then patterned using a mask to form the gate line.

It should be noted that for the sake of simplicity of the following figures, doping areas, doping profiles and other features of the substrate 500 are not shown in FIG. 8a and the subsequent figures. A possible layout of the surface is shown in FIG. 7. The first structure 120 may optionally be used as a mask for the fabrication of the doping areas or other semiconducting structures underneath the surface 510 of the substrate 500, as previously explained.

FIG. 8b shows a cross-sectional view of the device 100 after an additional thermal oxidation leading to generation of a further oxide layer 700, which is sometimes also referred to as POX or "poly oxide". The oxide layer 700 is generated on surfaces where silicon is at least indirectly available. Hence, the oxide layer 700 covers the insulating layer 520, which is only partially oxidized, as well as side walls of the first structure 120 at a level of the first layer 130. Since a thermal oxidation process consumes silicon of the respective structures when the oxide layer is formed, it also leads to rounding and smoothing of the surface of the polysilicon of the first layer 130.

In a next step, the result of which is schematically shown in the cross-sectional view of FIG. 8c, a thickness of the oxide layer 700 is increased by a chemical vapor deposition (CVD) process of a corresponding oxide material. As a consequence, the thickness of the oxide layer 700 is increased, and the oxide layer 700 also covers the oxynitride layer (second layer 140) of the first structure 120.

During a next process step, a stop layer 710 is deposited on top of the resulting structure. The stop layer 710 may comprise polysilicon, titanium nitride (TiN), silicon nitride ($SiN_x$), aluminum oxide ($AlO_x$), or the like. In the case shown in the cross-sectional view of FIG. 8d, an n-doped polysilicon layer is used as the stop layer 710.

As will become apparent later, the stop layer 710 as well as the oxide layer 700 may be part of the intermediate structure 170 previously described in the context of FIGS. 1 to 6. In this case the oxide layer 700 is the first insulating layer provided to the first structure 120 to laterally insulate the first structure 120.

The stop layer 710 may be in this case an electrically conductive structure which is electrically insulated from the first layer 130 by the oxide layer 700. Naturally, also other materials, such as insulating materials may be used. Hence, the stop layer 710 may comprise poly silicon, silicon nitride ($SiN_3$) or titanium nitride (TiN), to name but a few.

In the next process step, the stop layer 710 is patterned by use of a further reticle. Accordingly, in FIG. 8e the stop layer 710 is removed from the left side of the cross-sectional view and starts approximately at a center of the first structure 120.

In the next process steps, the resulting (gate) stack is covered with an oxide and planarized using a CMP technique, where the sacrificial layer (second layer) 140 acts as a stop layer. Optionally, some support pattern and/or an additional stop layer may have to be implemented.

Accordingly, in a next process step, which is schematically illustrated in a cross-sectional view of FIG. 8f, an insulating layer 720, which is also part of the immediate structure 170, is deposited. The insulating layer 720 comprises a BPSG layer as a sole layer. This process step is sometimes also referred to as a deposition of an inter-metallic dielectric (IMD).

In a next process step, which is schematically shown in the cross-sectional view of FIG. 8g, a stop layer 730 for subsequent CMP planarization is deposited. The further stop layer 730 may be fabricated, for instance, from oxynitride (SiON) or silicon nitride (SiN) deposited by a plasma enhanced deposition technique, a low pressure CVD process (LPCVD), or a similar deposition technique. The further stop layer 730 may also comprise titanium nitride (TiN).

In next process step, which is schematically depicted in the cross-sectional view of FIG. 8h, a further insulating layer 740 (e.g., IMD), which may comprise the same material as that of the insulting layer 720, is deposited. In other words, the further insulating layer 740 may also be fabricated from BPSG.

In a following process sub-step, the device 100 may be reduced in terms of its thickness such that a portion of the further stop layer 730 over the first structure 120 is removed along with the corresponding parts of the further insulating layer 740. This maybe achieved, for instance, by non-selective CMP planarization, which is not influenced by the presence of the further stop layer 730 on top of the first layer 120. In the case of the further stop layer 730 comprising silicon nitride, the corresponding CMP planarization should not be susceptible to at least this portion of the further stop layer 730. A cross-sectional view of the device 100 after this process sub-step is shown in FIG. 8i.

During a further process sub-step of a selective CMP process of the BPSG material of the insulating layer 720, the further insulating layer 740 and the insulating layer 720 are reduced in thickness such that the first structure 120 is again exposed. The first structure 120 along with the intermediate structure comprising the oxide layer 700, the stop layer 710 and the insulating layer 720 form a common surface 180. The common surface 180 may possibly be interrupted by the presence of the further stop layer 730. A schematic representation of the situation after the BPSG-CMP process step with a stop on the silicon nitride layer acting as the further stop layer 730 is illustrated in FIG. 8j.

Technologically, the two CMP steps described in context with FIGS. 8i and 8j may be performed in two separate CMP process steps or in the context of a single CMP process step. In the case of two separate CMP steps, the polishing recipes of the slurry as well as further process-related parameters may differ between the two CMP process sub-steps such that during the second sub-step the previously mentioned selectivity with respect to the further stop layer 730 is achieved, while the first sub-step lacks this selectivity and may be carried out on a time-controlled basis.

However, depending on the concrete design of a device, a chip or a whole wafer comprising many corresponding structures, two separate steps may eventually be rendered obsolete. The selectivity of a CMP process may be significantly influenced by the ratio of the area covered with the further stop layer 730 being polished at each moment in time. This may be the case when a ratio of the elevated further stop layer 730 on top of the first structure 120 may be lower than 5%, 2% or 1% compared to an overall area of the further stop layer 730. In such a case, there may simply not be enough material of the further stop layer 730 well above the surface of the first structure 120 to cause the desired selectivity of the CMP process. In other words, the corresponding CMP process may require 95% or more, 98% or more, or 99% or more of the total area to be covered with the further stop layer 730 in order to ensure the desired interruption of the CMP process.

Additionally or alternatively, the first structure 120 may also be exposed by etching a hole into the device 100 in an area of the first structure 120. Switching back to the cross-sectional view of FIG. 8h, this may be achieved by patterning and etching the hole in an area indicated in FIG. 8h as an area 750. By etching a hole into the device 100 in the area 750, which penetrates not only the further insulating layer 740 but also the further stop layer 730, a collar-like structure remains, so that a following CMP process step which is sensitive to the further stop layer 730 will yield a result similar to that of FIG. 8j.

This optional process modification may be used to generate a hole which starts from a surface 760 of the device 100 shown in FIG. 8h, and extends down to a plane indicated by arrows 770. The plane indicated by the arrows 770 is situated below the further stop layer 730 but above the surface of the first structure 120. This process step may replace the process step illustrated in FIG. 8i.

Next, a gate tap may optionally be patterned next to the sacrificial layer to realize an enlarged gate connection for the via metallization to be generated. The gate tap may be time-etched and therefore not be actively in contact with the transistor-source area.

In this further, optional process step illustrated in a cross-sectional view of FIG. 8k, first an additional opening 190 is generated. As illustrated in context with the embodiments shown in FIGS. 1 to 6, this opening 190 offers the possibility to implement an enlarged gate tap as a possible contact area for an electrical contact of the gate electrode structure. This process step is hence also referred to as gate tap etch.

As outlined in the context of the embodiments in FIGS. 1 to 6, generation of the opening 190 need not be as accurately placed as is shown in FIG. 8k. The opening 190, which may be generated by using a third reticle during a respective photo-lithographic process step, may be placed such that part of the second layer 140 is already removed. In other words, the opening 190 is to be aligned with the first structure 120 such that the opening 190 abuts the first or the second lateral edge 150, 160 of the first structure 120, or even comprises the previously mentioned lateral edges 150, 160. In case of the device 100 shown in FIG. 8k, the opening 190 abuts or comprises the second lateral edge 160 of the first structure 120.

Now the sacrificial layer (second layer 140) is removed, leaving a trench similar to Damascene techniques. Here it is a dual-Damascene trench because of the gate-tap feature sitting next to the gate.

In this next process step illustrated in the cross-sectional view of FIG. 8l, the remaining portions of the further stop layer 730 are removed along with at least parts of the second layer 140. In the cross-sectional view of FIG. 8l, the second layer is completely removed, leaving only the first layer 130. Technically, this is achieved by removing not only the oxide nitride material of the second layer 140, but also the silicon nitride of the further stop layer 730 at the same time.

Hence, this part of a process is sometimes also referred to as silicon nitride (SiN) removal. It may be achieved by using a wet etching process based on phosphorous acid, which is sometimes also called a poly etch solution. In the course of this process step, also the upper gate line part is removed simultaneously, since the second layer 140 is fabricated from oxide nitride and, hence, comprises also silicon nitride.

In a subsequent process step, schematically illustrated in the cross-sectional view of FIG. 8m, the conductive structure 200 is deposited. In the embodiment shown in FIG. 8m, the conductive structure 200 comprises titanium (Ti) and/or titanium nitride (TiN), which forms a film 780 being in contact with the first layer made of polysilicon. On top of the conductive film 780, a further conductive or metallic film 790 is deposited. This film 790 is made of tungsten (W) in the embodiment shown in FIG. 8m. In other words, the trench is covered with Ti/TiN as a barrier and contact layer, whereupon it is filled with tungsten (W) as the metal gate material.

After deposition of a previously mentioned film 780, 790, the thickness of the device 100 is reduced by a CMP process to form a common surface 210, which may be identical to or different from the previous common surface 180 of the intermediate structure 170 and the first structure 120.

Since the opening 190 is generated before the conductive structure 200 comprising the conductive films 780, 790 is deposited, the conductive structure 200 is also deposited into the opening 190, creating the previously mentioned gate tap. This gate tap increases the tolerances concerning further alignment processes, for instance, for contacting the conductive structure 200 from above. In other words, an enlarged interface area is generated.

Since the opening 190 comprises a depth which is less than the depth of the insulating layer 720, the gate tap created by the conductive structure 200 in the area of the opening 190 allows contacting the conductive structure well above the surface 110 and the surface 510 of the substrate 500.

In the case of process variations, also different material compositions of the conductive film 780 and/or the further conductive film 790 may be implemented. For instance, in the case of the further conductive film 790 comprising copper (Cu), the conductive film 780 may comprise tantalum (Ta) and/or tantalum nitride (TaN), which act as barrier and contact layers at the same time.

Depending on the material composition used for the conductive film 780, the respective film may further comprise additional materials. For instance, in the event of depositing titanium (Ti) on top of silicon, titanium silicide will be created (TiSi). It is possible to deposit the corresponding silicide directly or to deposit another material while forming the silicide as a component of the conductive film 780.

To summarize, after the tungsten-related CMP step (W-CMP), the final gate is formed and can be connected to the metallization lines.

In the following process step, the previously generated, self-aligned conductive structure is sealed off to withstand forthcoming oxide etching. This is achieved by depositing a polysilicon layer and/or a silicon nitride layer 800. This sealing layer 800 is deposited on the entire substrate or wafer as indicated in the cross-sectional view of FIG. 8n.

In a next process step, schematically illustrated in the cross-sectional view of FIG. 8o, the device 100 is coated with a resist layer 810, which is then patterned using a fourth optional reticle.

FIG. 8o illustrates that it is not a requirement to achieve perfect alignment of the patterned resist layer 810 with the conductive structure and/or the first layer 130. Accordingly, an overlap 820 of the resist layer 810 with the non-removed part of the sealing layer 800 is shown in FIG. 8o.

The cross-sectional view of FIG. 8o shows the result of photo-lithographic opening for the drain contact and subsequent poly etching, which may for instance be carried out based on the previously mentioned phosphorous acid. However, it should be noted that this process step is an optional step, which may be utilized to generate the drain contact of a source contact of the LDMOS 100. It may be used to pattern a field plate. Further details concerning generation and fabrication of such a field plate will be outlined in the context of FIGS. 9a to 9c.

In a following process step, which is schematically illustrated in the cross-sectional view of FIG. 8p, the insulating layer 720 comprising BPSG, and hence silicon dioxide ($SiO_2$), is formed by exposing the device 100 to a wet-etching solution. Etching silicon dioxide may be done by exposing the device 100 to a buffered fluoric acid (BHF). This etching solution is selective to silicon so that the insulating layer 720 as well as the sealing layer 800 for sealing off the conductive structure 200 and the first layer 130 along with the further structures described so far remain unchanged.

This process step is also referred to as drain opening silicon oxide edge with a stop on polysilicon. FIG. 8p also illustrates the previously described overlap 820, which is caused by the removal of the insulating layer 720 from the right-hand side on top of the stop layer 710. This means that in the embodiment described here, the intermediate structure 170 is at least partly removed from the device 100 during the process step illustrated in FIG. 8p.

In a next step, which is schematically illustrated in the cross-sectional view of FIG. 8q, the polysilicon layers being exposed in the cross-sectional view of FIG. 8p are removed using a wet-chemical etching process. The polysilicon layers removed comprise the stop layer 710 as well as the sealing layer 800. This is achieved by selectively etching silicon using a wet-chemical etchant capable of selectively etching titanium nitride (TiN), tungsten (W), and silicon oxide ($SiO_x$). Technologically, an etching solution comprising fluoric acid (HF), $HNO_3$ and $CH_3COOH$ may be used, for instance.

In a next process step which is schematically illustrated in the cross-sectional view of FIG. 8r, an insulating layer 830 is deposited. The insulating layer 830 here is an inter-metallic dielectric (IMD) which is deposited using a high-density plasma configuration (HDP) of a CVD (chemical vapor deposition) system.

During the following process steps comprising photolithographic patterning and etching sub-steps, contact holes are generated which penetrate at least the insulating layer 830. To be more precise, as also the cross-sectional view of FIG. 8s shows, a contact hole 840 is generated in the insulating layer 830 in the area of the former opening 190, which allows access to the further conducting film 790 of the conductive structure 200. A further contact hole 850 is generated at the outer rim of the cross-sectional view of FIG. 8s. The further contact hole 850 penetrates the insulating layer 830 as well as the oxide layer 700 and the insulating layer 520 to allow electrical contact with the substrate 500, for instance, to the sinker 620, the source terminal 640, or the drain terminal 660 (all shown in FIG. 7). In other words, the cross-sectional view of FIG. 8s illustrates generation of contact holes by etching.

In further process step, metallizations for contacting the gate electrode of the device 100, the drain contact and a field plate are deposited and patterned. These process steps are illustrated in the cross-sectional view of FIG. 8t.

In FIG. 8t the gate metallization 860 is deposited and patterned to make contact with the conductive structure 200 via the contact hole 840. Moreover, a drain metallization 870 is deposited and patterned such that electrical contact with the substrate 500 or a corresponding well is established via the contact hole 850. Moreover, a metallic field plate 880 is deposited onto the side wall of a stack formed by the first layer 130 and the conductive structure 200. The field plate 880 is deposited onto the side wall covered with the insulating layer 830.

The implementation of this additional field plate, as it is used for LDMOS transistors, may need some additional effort in process flows which are not based on an embodiment of the present invention. However, the present architecture also enables the possibility to realize a self-aligned shield (field plate 880) next to the gate (first layer 130 and conductive structure 200). The field plate 880 may be used to smooth off voltage peaks or to reduce capacitive feedback between a gate electrode and a drain electrode of the device 100.

The field plate 880 generated may be considered to be part of an intermediate structure 170. In this case, the intermediate structure 170 comprises, as a further conductive structure, the field plate 880 which is electrically insulated from the first structure 120 by at least a portion of the first insulating layer, which in this case is the oxide layer 700. Additionally or alternatively, the insulating layer 830 may also be considered to be the corresponding first insulating layer which electrically insulates the field plate 880 from the first structure 120.

In the case of a device 100 according to an embodiment of the present invention, the metallic structures 860, 870, 880 are fabricated from titanium (Ti) and/or titanium nitride (TiN). Naturally, any of the previously mentioned metallic or non-metallic conductive materials may also be used. Conformal deposition techniques such as thermal evaporation, sputtering or other chemical or physical evaporation techniques may be used.

In the following process step, which is schematically depicted in the cross-sectional view of FIG. 8u, an inter-metallic dielectric (IMD) 890 is deposited on top of the structure shown in FIG. 8t. The IMD 890 is once again BPSG, which serves to mechanically, chemically and electrically protect the device 100 from any unwanted influences.

Figure 9A:
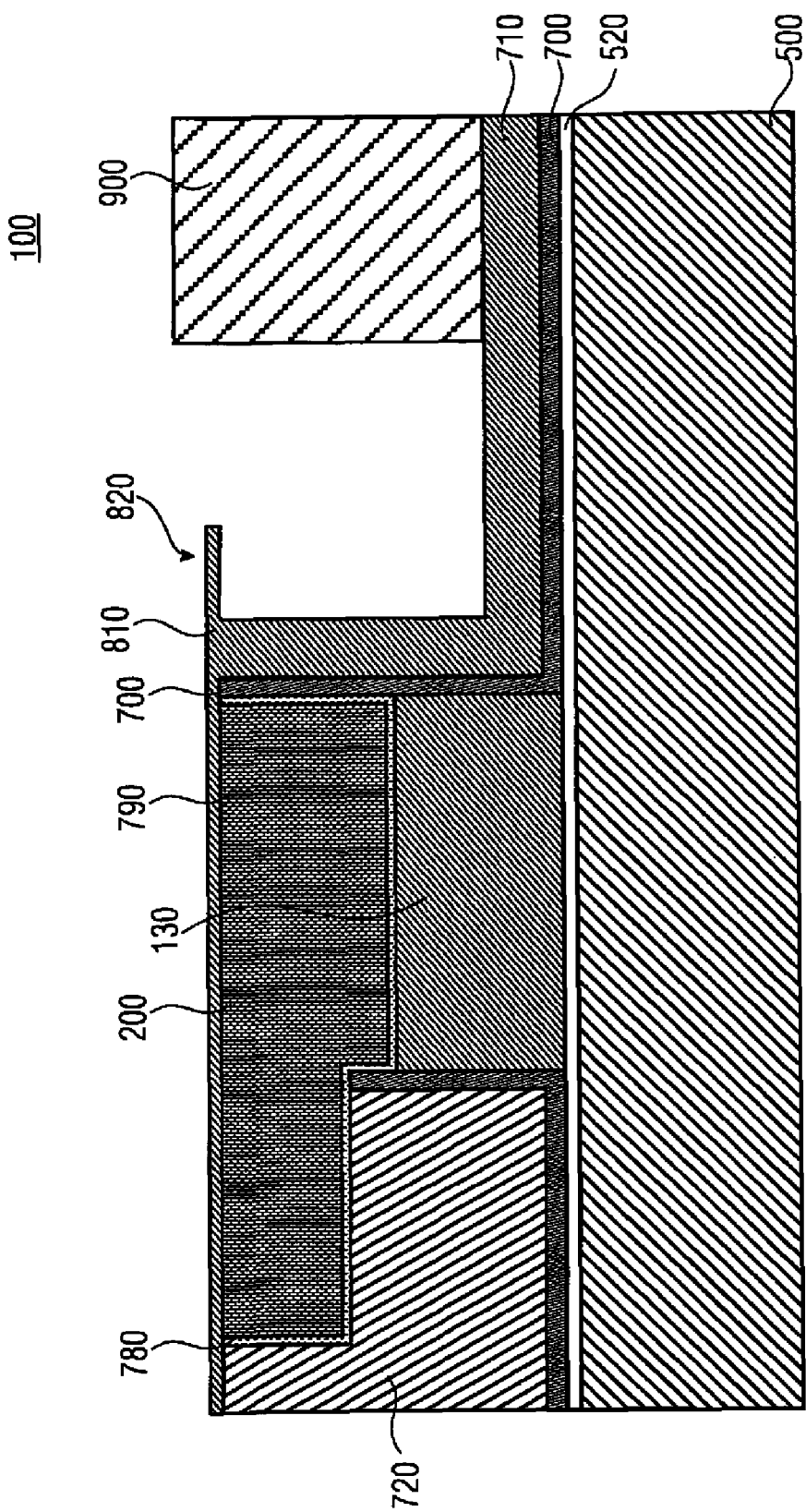
FIGS. 9a to 9c show cross-sectional views of a further device, fabricated by employing a method according to a further embodiment of the present invention, at different stages of the fabrication.

FIG. 9a illustrates an optional process flow according to an embodiment of the present invention, which may be inserted into the process flow described before. Starting with the cross-sectional view of the device 100 of FIG. 8p, a patterned resist layer 900 may be generated on top of the stop layer 710, which is fabricated from polysilicon, as described above.

In the following, the material of the stop layer 710 is used to generate a partial spacer structure to increase the distance between the field plate 880 of FIG. 8t in the area where the insulating layer 720 was removed earlier (right-hand side of FIG. 8). Naturally, the described technique may also be employed when an additional field plate is to be generated to improve the shielding or to further suppress the capacitive cross talk.

Figure 9B:
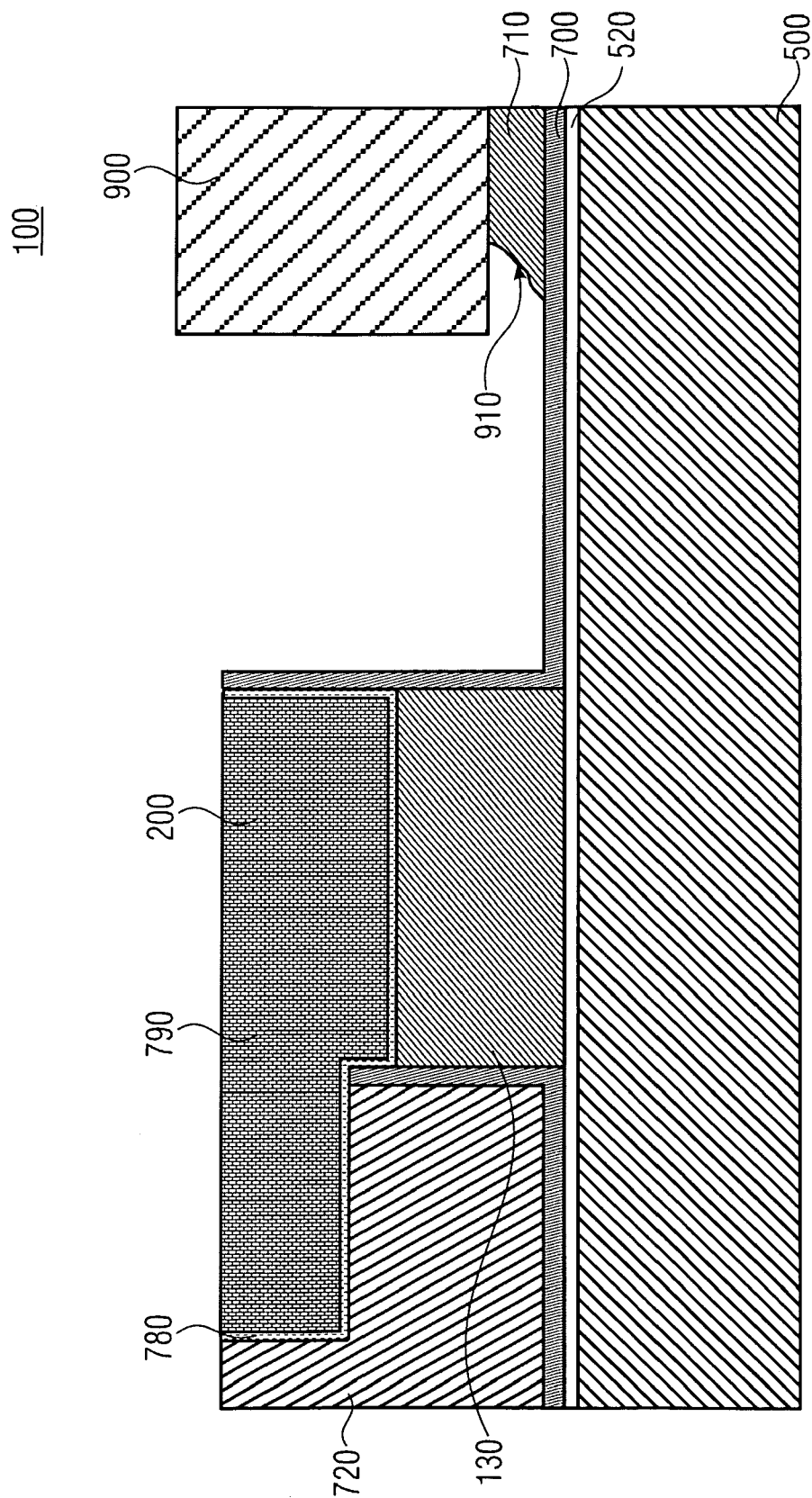

In a next process step, which is schematically illustrated in a cross-sectional view of FIG. 9b and which corresponds to the process step illustrated in FIG. 8q, the stop layer 710 is partially removed, for instance, by using a wet-etching solution. However, due to the resist layer 900, a portion of the stop layer 710 forming a ramp 910, on top of which the field plate 880 may be generated, is retained.

In further process steps, the resist layer 900 is removed, and the insulating layer 830 is deposited by the HDP process described in context with FIG. 8r. The insulating layer 830 is, hence, also formed as an insulating barrier on top of the stop layer 710 including the etched ramp 910.

Figure 9C:
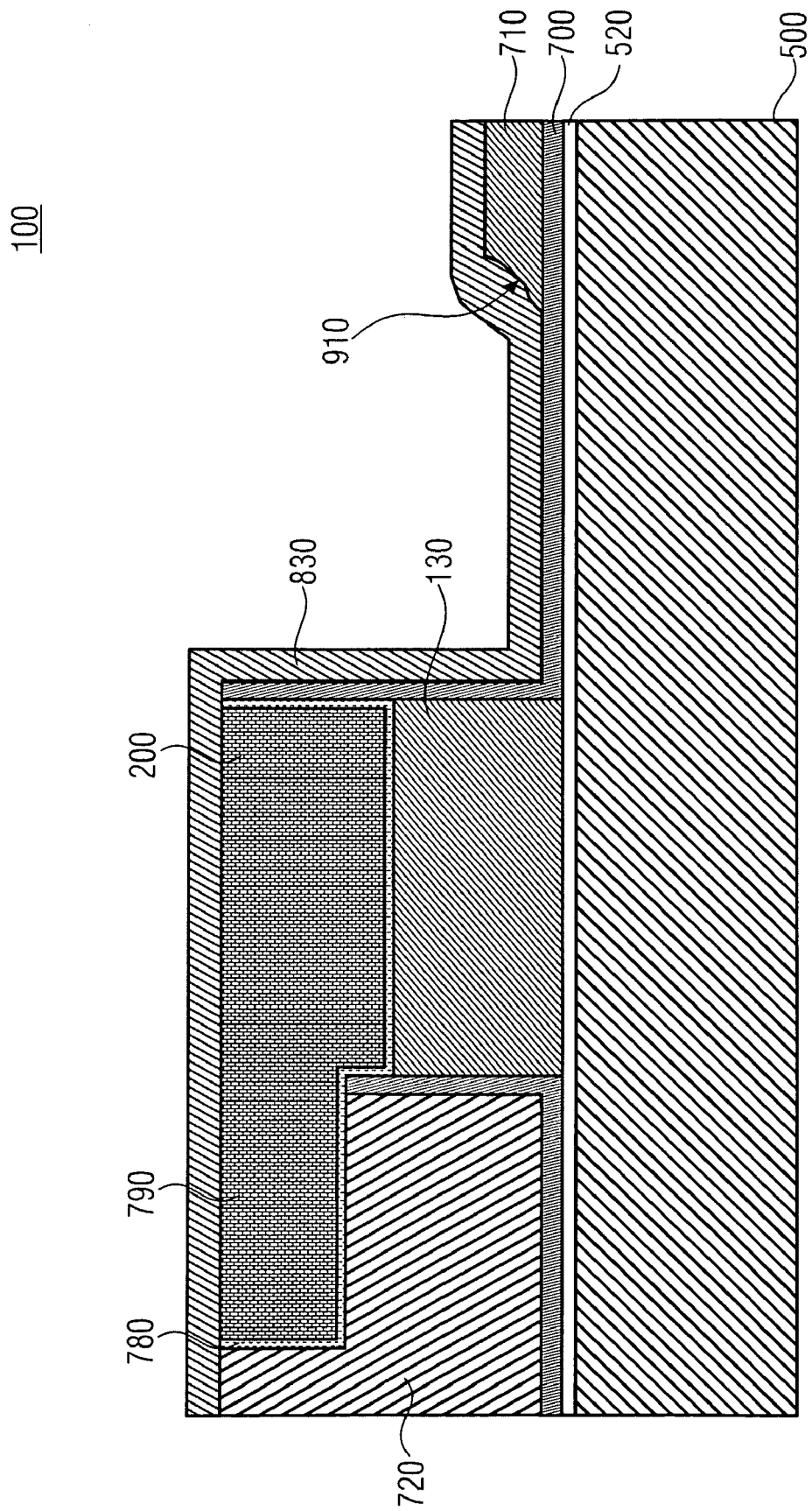

These process steps are illustrated in the cross-sectional view shown in FIG. 9c, which corresponds—apart from the presence of the ramp 910 of the stop layer 710—to the cross-sectional view of FIG. 8r. The process may then be continued as described in the context of FIG. 8s. The step of FIG. 8s may eventually be modified by changing the concrete positions of contact hole 850, to name just one of the possible modifications. The contact hole 850 may, for instance, be moved outside the area shown in FIGS. 8 and 9 to allow the field plate 850 deposited during the process step of FIG. 8t to cover the ramp 910 and to extend to the right hand side of the cross-sectional view of FIG. 9c over the remaining parts of the stop layer 710.

As noted before, the ramp 910 as well as the remaining parts of the stop layer 710 underneath the insulating layer 830 may offer the possibility of reducing electrical fields induced into the device 100 at these positions compared to the portions of the field plate 880 being positioned where the stop layer 710 is removed.

As a consequence, by means of conducting a minor adjustment as illustrated in the context of FIGS. 9a to 9c, the field plate 880 may be implemented with an increased distance to the substrate which might lead to a reduced influence of the field plate 880 on to the gate terminal or a drain terminal of the device 100.

In some of the embodiments according to the present invention, the device 100 as illustrated in FIGS. 8a to 8u and 9a to 9c may be modified by replacing the first structure 120 with a structured sacrificial layer 310. In other words, in the embodiment described above, the first layer 130 may be reduced to zero in terms of its thickness.

While the first layer 130 typically comprises a thickness in the range between 10 nm and 500 nm, with a typical value being around 200 nm, by completely replacing the first structure 120 with a structured sacrificial layer 310, FIGS. 8a to 8u and 9a to 9c illustrate further corresponding embodiments of the present invention of a device 300. In these cases, the structured sacrificial layer 310, which may be thought of as the replacement of the first structure 120, is used during a process of creating a processed area 320 (not shown in FIGS. 8 and 9) underneath the surface 110 or underneath the surface 510 of the substrate 500. As illustrated earlier in the context of FIGS. 3 to 4, the processed area 320 may comprise wells, doped areas or other semiconductor structures.

Moreover, in further embodiments according to the present invention, a fabrication of a device 100 based on a first structure 120 comprising more than two layers 130, 140 may also be implemented. For instance, the first structure 120 may comprise a stack of three or more layers. In the case of such a process flow, the stack may comprise two layers having an identical material composition (e.g., poly silicon), separated by a stop layer in between comprising a different material composition (e.g., a nitride, an oxide). Hence, during the step of removing the second layer 140 at least partially, the top layer of the three layers may be removed completely or partially, leaving the stop layer in between. In an optional process step, this stop layer may than be removed based on a different process (e.g., wet etching). This selective removal of the different materials may be achieved by using wet-etching process steps.

In this particular case, the lowest layer may be considered to be the first layer 130. When the stop layer is removed after removing the top layer, it may be considered to be the second layer 140. When the stop layer is not removed, the top layer may be considered to be the second layer 140. Depending on the concrete implementation, the first layer 130 may in this case considered to be the bottom layer or the stop layer.

While the foregoing has been particularly shown and described with reference to particular embodiments of the present invention, it will be understood by those skilled in the art that various other changes may be made to the forms and details without departing from the spirit and scope of the present invention. It is to be understood that various changes may be made in adapting to different embodiments without departing from the broader concept disclosed herein and comprehended by the claims that follow.

What is claimed is:

1. A method for providing a self-aligned conductive structure forming at least a part of a gate electrode structure of a field effect transistor, comprising:
   providing a first structure on a surface of an insulating layer, facing away from a substrate on which the insulating layer is arranged, the first structure comprising a first layer and a second layer, the first layer comprising electrically conductive material and being arranged between the second layer and the insulating layer;
   providing an intermediate structure on the surface of the insulating layer, the intermediate structure at least partially laterally abutting the first structure at a first lateral edge of the first structure;
   removing at least a part of the second layer, the removed part being adjacent to the first lateral edge; and
   providing the conductive structure such that the conductive structure replaces at least the removed part of the second layer and abuts the first lateral edge and forms, along with the first layer, the gate electrode structure.

2. The method according to claim 1, wherein removing comprises completely removing the second layer from the first structure.

3. The method according to claim 1, wherein the first structure comprises the first and the second layer which are vertically arranged and extend laterally from the first lateral edge to an opposite second lateral edge of the first structure, and wherein the intermediate structure abuts the first and the second lateral edge of the first structure.

4. The method according to claim 1, wherein the conductive structure is an electrically conductive structure, wherein the second layer is a sacrificial layer, wherein the second layer and the intermediate structure comprise different material compositions, wherein the first and second layers comprise different material compositions, and wherein the intermediate structure comprises an electrically insulating material in order to laterally insulate the conductive structure.

5. The method according to claim 1, wherein removing comprises generating an opening in at least the intermediate structure such that the opening is in immediate contact with the first lateral edge, a second lateral edge of the first structure opposite to the first lateral edge, or comprises the first lateral edge or the second lateral edge, wherein a depth of the opening is smaller than a height of the intermediate structure and a height of the first structure, and wherein providing the conductive structure comprises providing the conductive structure to the opening.

6. The method according to claim 1, wherein the conductive structure is provided such that a surface of the conductive structure and a surface of the intermediate structure form a common surface.

7. The method according to claim 1, wherein providing the intermediate structure comprises depositing at least a layer of a material of the intermediate structure, and reducing a thickness of the deposited layer such that a common surface of the intermediate structure and the first structure is formed.

8. The method according to claim 1, wherein providing the intermediate structure comprises providing a first insulating layer to the first structure to laterally insulate the first structure, and wherein providing the intermediate structure further comprises providing a further conductive structure electrically insulated from the first structure by at least a portion of the first insulating layer.

9. The method according to claim 8, further comprising forming a field plate from the further conductive structure.

10. The method according to claim 1, wherein the method is a method for providing a gate electrode structure of a transistor such that the conductive structure forms at least a part of the gate electrode structure.

11. The method according to claim 1, wherein the first and the second layer each comprise at least one layer material of a group of layer materials, the group of layer materials comprising an oxide, a nitride, an oxynitride, silicon, polysilicon, aluminum, copper, gold, tungsten, and silver, wherein the conductive structure comprises a conductive material of a group of conductive materials, the group of conductive materials comprising tungsten, titanium, titanium nitride, titanium silicide, tantalum, tantalum nitride, tantalum silicide, platinum, gold, silver, aluminum, and copper, and wherein the intermediate structure comprises an intermediate structure material of a group of intermediate structure materials, the group of intermediate structure materials comprising an oxide, a nitride, PSG, BPSG, and oxynitride.

12. A method for providing a conductive structure, comprising:
providing a structured sacrificial layer on a surface;
using the structured sacrificial layer as a mask;
providing, on the surface, an intermediate structure at least partially abutting a first lateral edge of the structured sacrificial layer;
removing at least a part of the structured sacrificial layer adjacent to the first lateral edge of the structured sacrificial layer; and
providing the conductive structure such that the conductive structure replaces at least the removed part of the structured sacrificial layer and abuts the first lateral edge,
wherein removing comprises generating an opening in at least the intermediate structure such that the opening is in immediate contact with the first lateral edge of the structured sacrificial layer or a second lateral edge of the structured sacrificial layer, the second lateral edge being opposite to the first lateral edge, or comprises the first lateral edge or the second lateral edge, wherein a depth of the opening is smaller than a height of the intermediate structure and a height of the structured sacrificial layer, and wherein providing the conductive structure comprises providing the conductive structure to the opening.

13. The method according to claim 12, wherein the structured sacrificial layer is completely removed.

14. The method according to claim 12, wherein the conductive structure is an electrically conductive structure, wherein the structured sacrificial layer and the intermediate structure comprise different material compositions, and wherein the intermediate structure comprises an electrically insulating material to laterally insulate the conductive structure.

15. The method according to claim 12, wherein providing the intermediate structure comprises depositing a layer of a material of the intermediate structure and reducing a thickness of the layer such that a common surface with the structured sacrificial layer is formed.

16. The method according to claim 12, wherein providing the intermediate structure comprises providing a first insulating layer to the structured sacrificial layer to laterally insulate the structured sacrificial layer, and comprises providing a further conductive structure electrically insulated from the structured sacrificial layer by at least a portion of the first insulating layer.

17. The method according to claim 16, further comprising forming a field plate from the further conductive structure.

18. The method according to claim 12, wherein the structured sacrificial layer comprises at least one layer material of a group of layer materials, the group of layer materials comprising an oxide, a nitride, an oxynitride, silicon, polysilicon, aluminum, copper, gold, tungsten, and silver, wherein the conductive structure comprises a conductive material of a group of conductive materials, the group of conductive materials comprising tungsten, titanium, titanium nitride, titanium silicide, tantalum, tantalum nitride, tantalum silicide, platinum, gold, silver, and copper, aluminum, and wherein the intermediate structure comprises an intermediate structure material of a group of intermediate structure materials, the group of intermediate structure materials comprising an oxide, a nitride, PSG, BPSG, and oxynitride.

19. The method according to claim 12, wherein the method comprises processing a substrate using the structured sacrificial layer as the mask resulting in a processed area beneath the surface, wherein the surface is a surface of the substrate or a surface of a layer arranged on the substrate.

20. The method according to claim 12, wherein the method comprises doping a substrate by ion implantation using the structured sacrificial layer as the mask, wherein the surface is a surface of the substrate or a surface of a layer arranged on the substrate.

21. The method according to claim 12, wherein the method is a method for providing a gate electrode structure of a transistor, wherein the conductive structure is at least part of the gate electrode structure.

22. The method according to claim 1, wherein providing the first structure is performed such that the electrically conductive material comprises polysilicon.

23. The method according to claim 1, wherein providing the first structure is performed such that the insulating layer laterally extends beyond a footprint of the first structure.

24. The method according to claim 23, wherein removing comprises generating an opening in at least the intermediate structure such that the opening is in immediate contact with the first lateral edge, a second lateral edge of the first structure opposite to the first lateral edge, or comprises the first lateral edge or the second lateral edge, wherein a depth of the opening is smaller than a height of the intermediate structure and a height of the first structure, and wherein providing the conductive structure comprises providing the conductive structure to the opening so that an interface area of the conductive structure for contacting structures on top of the conductive structure, is increased.

25. The method according to claim 12, wherein the self-aligned conductive structure forms at least a part of a gate electrode structure of a field effect transistor, where providing the structured sacrificial layer on the surface is performed by providing a first structure on a surface of an insulating layer, facing away from a substrate on which the insulating layer is arranged, the first structure comprising an electrically conductive layer and the structured sacrificial layer having the first lateral edge in common, the electrically conductive layer being arranged between the structured sacrificial layer and the insulating layer, and providing the conductive structure is performed such that the conductive structure forms, along with the electrically conductive layer, the gate electrode structure.

* * * * *